United States Patent
Ito

(10) Patent No.: US 11,054,485 B2
(45) Date of Patent: Jul. 6, 2021

(54) POWER SUPPLY MONITORING APPARATUS AND POWER SUPPLY MONITORING METHOD

(71) Applicant: JTEKT Corporation, Osaka (JP)

(72) Inventor: Takanori Ito, Nishio (JP)

(73) Assignee: JTEKT Corporation, Osaka (JP)

( * ) Notice: Subject to any disclaimer, the term of this patent is extended or adjusted under 35 U.S.C. 154(b) by 99 days.

(21) Appl. No.: 16/524,371

(22) Filed: Jul. 29, 2019

(65) Prior Publication Data

US 2020/0041578 A1 Feb. 6, 2020

(30) Foreign Application Priority Data

Aug. 1, 2018 (JP) .............................. JP2018-144983

(51) Int. Cl.
*G01R 31/40* (2020.01)

(52) U.S. Cl.
CPC .................................... *G01R 31/40* (2013.01)

(58) Field of Classification Search
CPC ...................................................... G01R 31/40
USPC ..................................................... 324/754.01
See application file for complete search history.

(56) References Cited

U.S. PATENT DOCUMENTS

| 4,891,743 | A * | 1/1990 | May | G01R 31/40 |
| | | | | 363/87 |
| 7,878,278 | B2 * | 2/2011 | Chamaillard | B62D 61/10 |
| | | | | 180/24.03 |
| 7,898,278 | B2 * | 3/2011 | Flynn | H03K 19/0016 |
| | | | | 324/764.01 |
| 9,019,067 | B2 * | 4/2015 | Bryla | G05B 19/042 |
| | | | | 340/3.1 |
| 10,768,241 | B2 * | 9/2020 | Kataoka | H02J 9/06 |
| 2002/0044062 | A1 | 4/2002 | Yoshioka | |
| 2006/0071804 | A1 * | 4/2006 | Yoshioka | G08G 1/205 |
| | | | | 340/636.1 |

FOREIGN PATENT DOCUMENTS

JP 2014-204570 A 10/2014

OTHER PUBLICATIONS

Extended European Search Report dated Dec. 4, 2019 in European Patent Application No. 191899009.4, citing document AA therein, 8 pages.

* cited by examiner

*Primary Examiner* — Tung X Nguyen
*Assistant Examiner* — Robert P Alejnikov, Jr.
(74) *Attorney, Agent, or Firm* — Oblon, McClelland, Maier & Neustadt, L.L.P.

(57) ABSTRACT

A power supply monitoring apparatus includes dual supply path controllers. The controllers continuously test the power supply and the supply paths by alternating power states and monitoring the response from the supply path. If an interruption in normal operation is sensed in one supply path, information regarding the abnormality can be sent to the other controller, thereby allowing for continued operation and monitoring despite the failure of a supply path.

8 Claims, 13 Drawing Sheets

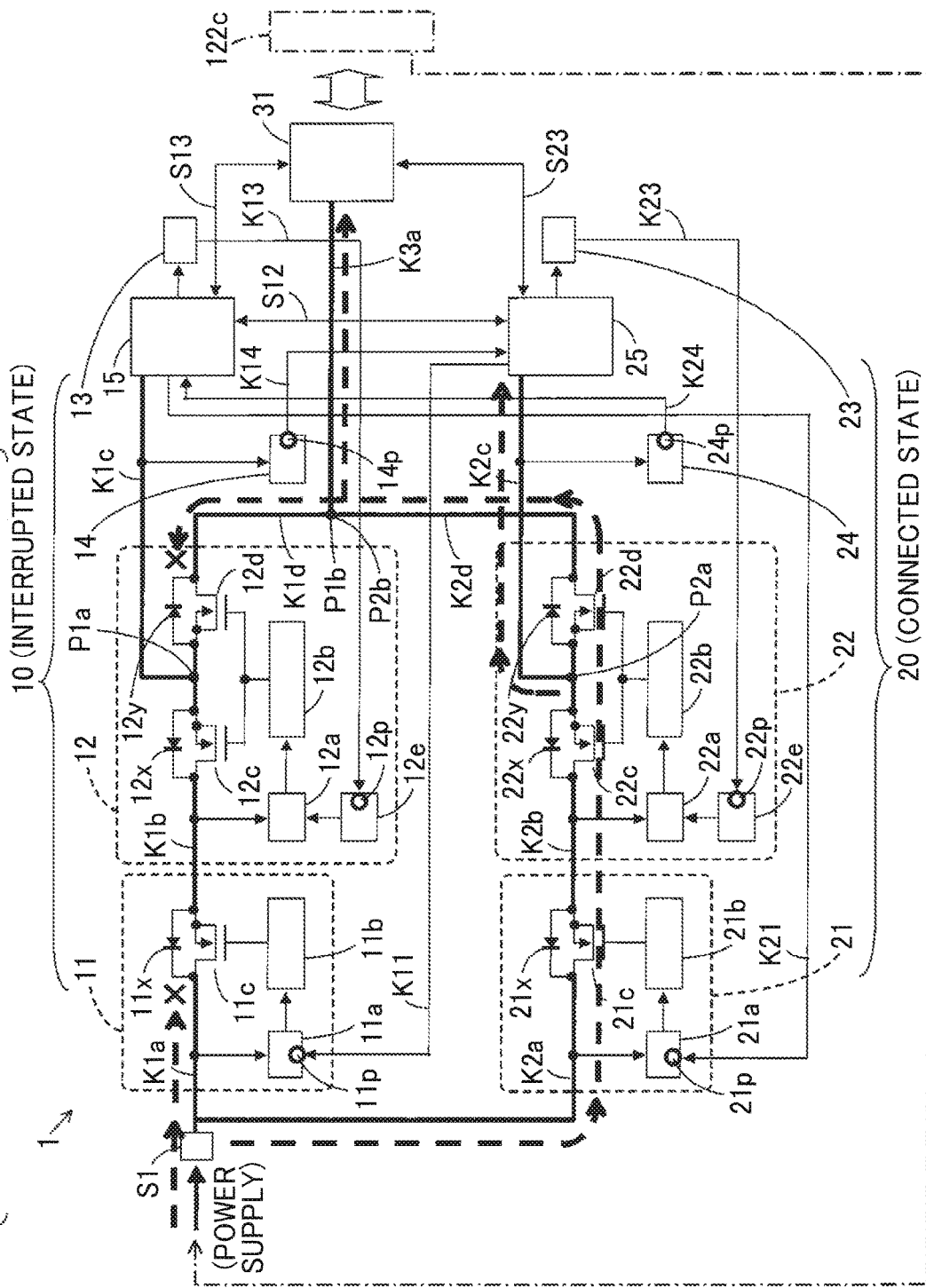

POWER SUPPLY MONITORING APPARATUS AND POWER SUPPLY MONITORING METHOD

INCORPORATION BY REFERENCE

The disclosure of Japanese Patent Application No. 2018-144983 filed on Aug. 1, 2018 including the specification, drawings and abstract, is incorporated herein by reference in its entirety.

BACKGROUND OF THE INVENTION

1. Field of the Invention

The present invention relates to a power supply monitoring apparatus and a power supply monitoring method.

2. Description of the Related Art

Hitherto, control apparatuses including a central processing unit (CPU) or the like as a controller may have a dual system for the controller (such as a CPU) in order to secure greater safety. The control apparatuses may also have a power supply monitoring apparatus configured to monitor electric power to be supplied and interrupt the electric power to the controller or the like in a case of, for example, an overvoltage or a low voltage.

For example, Japanese Patent Application Publication No. 2014-204570 (JP 2014-204570 A) describes a power supply monitoring apparatus and a power supply monitoring method with a dual system for the power supply monitoring apparatus and a diagnostic circuit. The power supply monitoring apparatus monitors a power supply voltage to be supplied to a load apparatus via a first power supply line. The diagnostic circuit includes a microcomputer configured to perform self-diagnosis of the power supply monitoring apparatus. The power supply monitoring apparatus monitors the power supply voltage to be supplied to the load apparatus, and interrupts the power supply voltage to the load apparatus through the first power supply line in a case of an overvoltage or a low voltage. JP 2014-204570 A also describes a method for self-diagnosis of the power supply monitoring apparatus using the diagnostic circuit including the microcomputer and a second power supply line through which the diagnostic circuit supplies or interrupts the power supply voltage to the load apparatus. In JP 2014-204570 A, the power supply voltage is supplied to the load apparatus through the second power supply line while the diagnostic circuit is performing the self-diagnosis of the power supply monitoring apparatus.

In JP 2014-204570 A, the configuration and the self-diagnosis method are described about the power supply monitoring apparatus configured to supply or interrupt the power supply voltage to the load apparatus, but neither the configuration nor the self-diagnosis method is described about an apparatus configured to supply or interrupt the power supply voltage to the diagnostic circuit including the microcomputer (corresponding to the controller). If the power supply voltage to be supplied or interrupted by the power supply monitoring apparatus is input to the diagnostic circuit, the power supply voltage to the diagnostic circuit is interrupted when the diagnostic circuit inspects an interruption operation during the self-diagnosis of the power supply monitoring apparatus. Therefore, the self-diagnosis cannot be performed appropriately.

SUMMARY OF THE INVENTION

It is one object of the present invention to provide a power supply monitoring apparatus and a power supply monitoring method in which, in a system including dual-system controllers, a connected state and an interrupted state can be switched depending on electric power supplied from a power supply to each controller and self-diagnosis of the connected state and the interrupted state can appropriately be performed by each controller.

A power supply monitoring apparatus according to one aspect of the present invention includes:

a first controller to be supplied with electric power from a power supply via a first power supply path;

a second controller to be supplied with the electric power from the power supply via a second power supply path;

a first power supplying and interrupting device configured to switch a connected state and an interrupted state of the first power supply path from the power supply to the first controller depending on the electric power supplied from the power supply; and a second power supplying and interrupting device configured to switch a connected state and an interrupted state of the second power supply path from the power supply to the second controller depending on the electric power supplied from the power supply.

In the power supply monitoring apparatus, the first controller is configured to inspect switching of the connected state and the interrupted state by the second power supplying and interrupting device when the power supply is turned ON, and the second controller is configured to inspect switching of the connected state and the interrupted state by the first power supplying and interrupting device when the power supply is turned ON.

According to the power supply monitoring apparatus of the aspect described above, a dual system is constructed such that the first power supplying and interrupting device is provided in the first power supply path through which the electric power is supplied from the power supply to the first controller and the second power supplying and interrupting device is provided in the second power supply path through which the electric power is supplied from the power supply to the second controller. The first power supplying and interrupting device switches the connected state and the interrupted state depending on the electric power supplied from the power supply. The inspection (self-diagnosis) of the first power supplying and interrupting device is performed by the second controller instead of the first controller. The inspection (self-diagnosis) of the second power supplying and interrupting device is performed by the first controller instead of the second controller. Thus, in the system including the dual-system controllers, the connected state and the interrupted state can be switched depending on the electric power supplied from the power supply to each controller, and the self-diagnosis of the connected state and the interrupted state can appropriately be performed by each controller.

In the power supply monitoring apparatus of the aspect described above, a communication circuit may be connected to the first controller and the second controller to enable transmission and reception of information between the first controller and the second controller. The first controller may be configured to: distinguish, when the first controller is started, whether the first controller is currently started by turning ON the power supply or by inspecting the first power supplying and interrupting device through transmission and reception of information to and from the second controller; inspect the second power supplying and interrupting device when the first controller is started by turning ON the power supply, restart the second controller when a result of inspection of the second power supplying and interrupting device is normal, transmit the result of the inspection when a request for the result of the inspection is received from the second controller, and wait for inspection of the first power supplying and interrupting device by the second controller; and transmit a request for a result of the inspection of the first power supplying and interrupting device to the second controller and receive the result of the inspection when the first controller is started by inspecting the first power supplying and interrupting device, and advance to first normal-case control, which is prepared for a case where the first controller is normal, when the received result of the inspection is normal. The second controller may be configured to: distinguish, when the second controller is started, whether the second controller is currently started by turning ON the power supply or by inspecting the second power supplying and interrupting device through transmission and reception of information to and from the first controller; wait for the inspection of the second power supplying and interrupting device by the first controller when the second controller is started by turning ON the power supply; and transmit the request for the result of the inspection of the second power supplying and interrupting device to the first controller and receive the result of the inspection when the second controller is started by inspecting the second power supplying and interrupting device, inspect the first power supplying and interrupting device when the received result of the inspection is normal, restart the first controller when the result of the inspection of the first power supplying and interrupting device is normal, transmit the result of the inspection when the request for the result of the inspection is received from the first controller, and advance to second normal-case control, which is prepared for a case where the second controller is normal.

According to the power supply monitoring apparatus of the aspect described above, distinction is made as to whether the controller is started by turning ON the power supply or by inspection. Thus, the first controller can appropriately inspect the second power supplying and interrupting device, and the second controller can appropriately inspect the first power supplying and interrupting device.

In the power supply monitoring apparatus of the aspect described above, the first power supplying and interrupting device may include a first preceding switching circuit, a first succeeding switching circuit, a first monitoring circuit, and a first status monitoring circuit. The first preceding switching circuit is provided on a power supply side in the first power supply path and is switched to the connected state or the interrupted state depending on a voltage supplied from the power supply or a control signal output from the second controller. The first succeeding switching circuit is provided on a first controller side in the first power supply path and is switched to the connected state or the interrupted state. The first monitoring circuit is configured to monitor an operation of the first controller and switch the first succeeding switching circuit from the connected state to the interrupted state when the first monitoring circuit determines that the operation of the first controller is abnormal. The first status monitoring circuit is configured to enable the second controller to monitor whether the electric power is supplied from the first succeeding switching circuit to the first controller. The second power supplying and interrupting device may include a second preceding switching circuit, a second succeeding switching circuit, a second monitoring circuit, and a second status monitoring circuit. The second preceding switching circuit is provided on the power supply side in the second power supply path and is switched to the connected state or the interrupted state depending on the voltage supplied from the power supply or a control signal output from the first controller. The second succeeding switching circuit is provided on a second controller side in the second power supply path and is switched to the connected state or the interrupted state. The second monitoring circuit is configured to monitor an operation of the second controller and switch the second succeeding switching circuit from the connected state to the interrupted state when the second monitoring circuit determines that the operation of the second controller is abnormal. The second status monitoring circuit is configured to enable the first controller to monitor whether the electric power is supplied from the second succeeding switching circuit to the second controller.

According to the power supply monitoring apparatus of the aspect described above, the first power supplying and interrupting device and the second power supplying and interrupting device can be implemented by appropriate circuits.

In the power supply monitoring apparatus of the aspect described above, the first controller may be configured to, for the inspection of the second power supplying and interrupting device: cause the second status monitoring circuit to check that the electric power is supplied to the second controller; transmit simulative abnormality request information to the second controller to simulate an abnormality of the operation of the second controller and switch the second succeeding switching circuit to the interrupted state by using the second monitoring circuit, and cause the second status monitoring circuit to check that the electric power is not supplied to the second controller; and output a control signal for switching the second preceding switching circuit to the interrupted state, output a control signal for switching the second preceding switching circuit to the connected state, and cause the second status monitoring circuit to check that the electric power is supplied to the second controller to determine that the second power supplying and interrupting device is normal. The second controller may be configured to, for the inspection of the first power supplying and interrupting device: cause the first status monitoring circuit to check that the electric power is supplied to the first controller; transmit simulative abnormality request information to the first controller to simulate an abnormality of the operation of the first controller and switch the first succeeding switching circuit to the interrupted state by using the first monitoring circuit, and cause the first status monitoring circuit to check that the electric power is not supplied to the first controller; and output a control signal for switching the first preceding switching circuit to the interrupted state, output a control signal for switching the first preceding switching circuit to the connected state, and cause the first status monitoring circuit to check that the electric power is supplied to the first controller to determine that the first power supplying and interrupting device is normal.

According to the power supply monitoring apparatus of the aspect described above, the first controller can appropriately inspect the connected state and the interrupted state of the second power supplying and interrupting device, and the second controller can appropriately inspect the connected state and the interrupted state of the first power supplying and interrupting device.

In the power supply monitoring apparatus of the aspect described above, photonic devices each configured to transmit a signal while electrically insulating an input side from an output side may be provided in a path from the first status monitoring circuit to the second controller, a path from the second status monitoring circuit to the first controller, a path from the first controller to the second preceding switching circuit, a path from the second controller to the first preceding switching circuit, a path from the first monitoring circuit to the first succeeding switching circuit, and a path from the second monitoring circuit to the second succeeding switching circuit.

The power supply monitoring apparatus has the paths through which the first controller can inspect the second power supplying and interrupting device, and the paths through which the second controller can inspect the first power supplying and interrupting device. Therefore, a current may stray from the first power supply path into the second power supply path, and from the second power supply path into the first power supply path. According to the power supply monitoring apparatus of the aspect described above, the stray current can appropriately be prevented such that the photonic devices (for example, photocouplers) configured to transmit signals along with electrical insulation are provided in the paths into which a current may stray.

The power supply monitoring apparatus of the aspect described above may further include a peripheral circuit configured such that, when at least one of the first power supplying and interrupting device and the second power supplying and interrupting device is in the connected state, the peripheral circuit is supplied with the electric power from the power supply via the at least one of the first power supplying and interrupting device and the second power supplying and interrupting device that is in the connected state.

According to the power supply monitoring apparatus of the aspect described above, the peripheral circuit is supplied with the electric power from the first power supplying and interrupting device when the first power supplying and interrupting device is in the connected state and the second power supplying and interrupting device is in the interrupted state. The peripheral circuit is supplied with the electric power from the second power supplying and interrupting device when the first power supplying and interrupting device is in the interrupted state and the second power supplying and interrupting device is in the connected state. Thus, the peripheral circuit can appropriately be supplied with the electric power.

In the power supply monitoring apparatus of the aspect described above, the first power supplying and interrupting device may include a first controller terminal and a first peripheral terminal. The first controller terminal is connected to the first controller and supplies the electric power to the first controller. The first peripheral terminal is connected to the peripheral circuit and supplies the electric power to the peripheral circuit. When the first power supplying and interrupting device is in the connected state, the first controller terminal and the first peripheral terminal may be brought into conduction, and both the first controller terminal and the first peripheral terminal may be supplied with the electric power from the first preceding switching circuit. When the first power supplying and interrupting device is in the interrupted state, the first controller terminal and the first peripheral terminal may be connected so that a current flows only in a direction from the first controller terminal to the first peripheral terminal, and neither the first controller terminal nor the first peripheral terminal may be supplied with the electric power from the first preceding switching circuit. The second power supplying and interrupting device may include a second controller terminal and a second peripheral terminal. The second controller terminal is connected to the second controller and supplies the electric power to the second controller. The second peripheral terminal is connected to the peripheral circuit and supplies the electric power to the peripheral circuit. When the second power supplying and interrupting device is in the connected state, the second controller terminal and the second peripheral terminal may be brought into conduction, and both the second controller terminal and the second peripheral terminal may be supplied with the electric power from the second preceding switching circuit. When the second power supplying and interrupting device is in the interrupted state, the second controller terminal and the second peripheral terminal may be connected so that the current flows only in a direction from the second controller terminal to the second peripheral terminal, and neither the second controller terminal nor the second peripheral terminal may be supplied with the electric power from the second preceding switching circuit.

According to the power supply monitoring apparatus of the aspect described above, the peripheral circuit can appropriately be supplied with the electric power. That is, the peripheral circuit is supplied with the electric power both from the first power supplying and interrupting device and from the second power supplying and interrupting device when the first power supplying and interrupting device is in the connected state and the second power supplying and interrupting device is in the connected state. When the first power supplying and interrupting device is in the connected state and the second power supplying and interrupting device is in the interrupted state, the peripheral circuit is supplied with the electric power from the first power supplying and interrupting device alone, and the current does not stray into the second controller. When the first power supplying and interrupting device is in the interrupted state and the second power supplying and interrupting device is in the connected state, the peripheral circuit is supplied with the electric power from the second power supplying and interrupting device alone, and the current does not stray into the first controller.

A power supply monitoring method according to another aspect of the present invention uses a first controller, a second controller, a first power supplying and interrupting device, and a second power supplying and interrupting device. The first controller is supplied with electric power from a power supply via a first power supply path. The second controller is supplied with the electric power from the power supply via a second power supply path. The first power supplying and interrupting device is configured to switch a connected state and an interrupted state of the first power supply path from the power supply to the first controller depending on the electric power supplied from the power supply. The second power supplying and interrupting device is configured to switch a connected state and an interrupted state of the second power supply path from the power supply to the second controller depending on the electric power supplied from the power supply.

The power supply monitoring method includes: inspecting, by using the first controller, switching of the connected state and the interrupted state by the second power supplying and interrupting device when the power supply is turned ON; and inspecting, by using the second controller, switching of the connected state and the interrupted state by the first power supplying and interrupting device when the power supply is turned ON.

According to the power supply monitoring method of the aspect described above, in the dual system constructed by the first power supply path, the first controller, and the first power supplying and interrupting device configured to switch the connected state and the interrupted state depending on the electric power supplied from the power supply, and by the second power supply path, the second controller, and the second power supplying and interrupting device configured to switch the connected state and the interrupted state depending on the electric power supplied from the power supply, the connected state and the interrupted state can be switched depending on the electric power supplied from the power supply to each controller, and the self-diagnosis of the connected state and the interrupted state can appropriately be performed by each controller. The inspection (self-diagnosis) of the first power supplying and interrupting device is performed by the second controller instead of the first controller. The inspection (self-diagnosis) of the second power supplying and interrupting device is performed by the first controller instead of the second controller. Thus, the inspection (self-diagnosis) can be performed appropriately.

In the power supply monitoring method of the aspect described above, a communication circuit may be connected to the first controller and the second controller to enable transmission and reception of information between the first controller and the second controller. The power supply monitoring method may include: distinguishing, by the first controller, when the first controller is started, whether the first controller is currently started by turning ON the power supply or by inspecting the first power supplying and interrupting device through transmission and reception of information to and from the second controller; inspecting, by the first controller, the second power supplying and interrupting device when the first controller is started by turning ON the power supply, restarting the second controller when a result of inspection of the second power supplying and interrupting device is normal, transmitting the result of the inspection when a request for the result of the inspection is received from the second controller, and waiting for inspection of the first power supplying and interrupting device by the second controller; transmitting, by the first controller, a request for a result of the inspection of the first power supplying and interrupting device to the second controller and receiving the result of the inspection when the first controller is started by inspecting the first power supplying and interrupting device, and advancing to first normal-case control, which is prepared for a case where the first controller is normal, when the received result of the inspection is normal; distinguishing, by the second controller, when the second controller is started, whether the second controller is currently started by turning ON the power supply or by inspecting the second power supplying and interrupting device through transmission and reception of information to and from the first controller; waiting, by the second controller, for the inspection of the second power supplying and interrupting device by the first controller when the second controller is started by turning ON the power supply; and transmitting, by the second controller, the request for the result of the inspection of the second power supplying and interrupting device to the first controller and receiving the result of the inspection when the second controller is started by inspecting the second power supplying and interrupting device, inspecting the first power supplying and interrupting device when the received result of the inspection is normal, restarting the first controller when the result of the inspection of the first power supplying and interrupting device is normal, transmitting the result of the inspection when the request for the result of the inspection is received from the first controller, and advancing to second normal-case control, which is prepared for a case where the second controller is normal.

According to the power supply monitoring method of the aspect described above, distinction is made as to whether the controller is started by turning ON the power supply or by inspection. Thus, the first controller can appropriately inspect the second power supplying and interrupting device, and the second controller can appropriately inspect the first power supplying and interrupting device.

In the power supply monitoring method of the aspect described above, the first power supplying and interrupting device may include a first preceding switching circuit, a first succeeding switching circuit, a first monitoring circuit, and a first status monitoring circuit. The first preceding switching circuit is provided on a power supply side in the first power supply path and is switched to the connected state or the interrupted state depending on a voltage supplied from the power supply or a control signal output from the second controller. The first succeeding switching circuit is provided on a first controller side in the first power supply path and is switched to the connected state or the interrupted state. The first monitoring circuit is configured to monitor an operation of the first controller and switch the first succeeding switching circuit from the connected state to the interrupted state when the first monitoring circuit determines that the operation of the first controller is abnormal. The first status monitoring circuit is configured to enable the second controller to monitor whether the electric power is supplied from the first succeeding switching circuit to the first controller. The second power supplying and interrupting device may include a second preceding switching circuit, a second succeeding switching circuit, a second monitoring circuit, and a second status monitoring circuit. The second preceding switching circuit is provided on the power supply side in the second power supply path and is switched to the connected state or the interrupted state depending on the voltage supplied from the power supply or a control signal output from the first controller. The second succeeding switching circuit is provided on a second controller side in the second power supply path and is switched to the connected state or the interrupted state. The second monitoring circuit is configured to monitor an operation of the second controller and switch the second succeeding switching circuit from the connected state to the interrupted state when the second monitoring circuit determines that the operation of the second controller is abnormal. The second status monitoring circuit is configured to enable the first controller to monitor whether the electric power is supplied from the second succeeding switching circuit to the second controller. The power supply monitoring method may include, for the inspection of the second power supplying and interrupting device: causing, by the first controller, the second status monitoring circuit to check that the electric power is supplied to the second controller, transmitting simulative abnormality request information to the second controller to simulate an abnormality of the operation of the second controller and switch the second succeeding switching circuit to the interrupted state by using the second monitoring circuit, and causing the second status monitoring circuit to check that the electric power is not supplied to the second controller; and outputting, by the first controller, a control signal for switching the second preceding switching circuit to the interrupted state, outputting a control signal for switching the second preceding switching circuit to the connected state, and causing the second status monitoring circuit to check that the electric power is supplied to the second controller. The power supply monitoring method may include, for the inspection of the first power supplying and interrupting device: causing, by the second controller, the first status monitoring circuit to check that the electric power is supplied to the first controller, transmitting simulative abnormality request information to the first controller to simulate an abnormality of the operation of the first controller and switch the first succeeding switching circuit to the interrupted state by using the first monitoring circuit, and causing the first status monitoring circuit to check that the electric power is not supplied to the first controller; and outputting, by the second controller, a control signal for switching the first preceding switching circuit to the interrupted state, outputting a control signal for switching the first preceding switching circuit to the connected state, and causing the first status monitoring circuit to check that the electric power is supplied to the first controller.

According to the power supply monitoring method of the aspect described above, the first power supplying and interrupting device and the second power supplying and interrupting device can be implemented by appropriate circuits. By using those circuits, the first controller can inspect the connected state and the interrupted state of the second power supplying and interrupting device through appropriate procedures, and the second controller can inspect the connected state and the interrupted state of the first power supplying and interrupting device through appropriate procedures.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein:

FIG. 7 is a diagram for describing that, when a first power supplying and interrupting device is in an interrupted state and a second power supplying and interrupting device is in a connected state, electric power is supplied from the second power supplying and interrupting device to a peripheral apparatus and no current strays into the first controller from the second power supplying and interrupting device via a common power supply path.

DETAILED DESCRIPTION OF EMBODIMENTS

Figure 1:
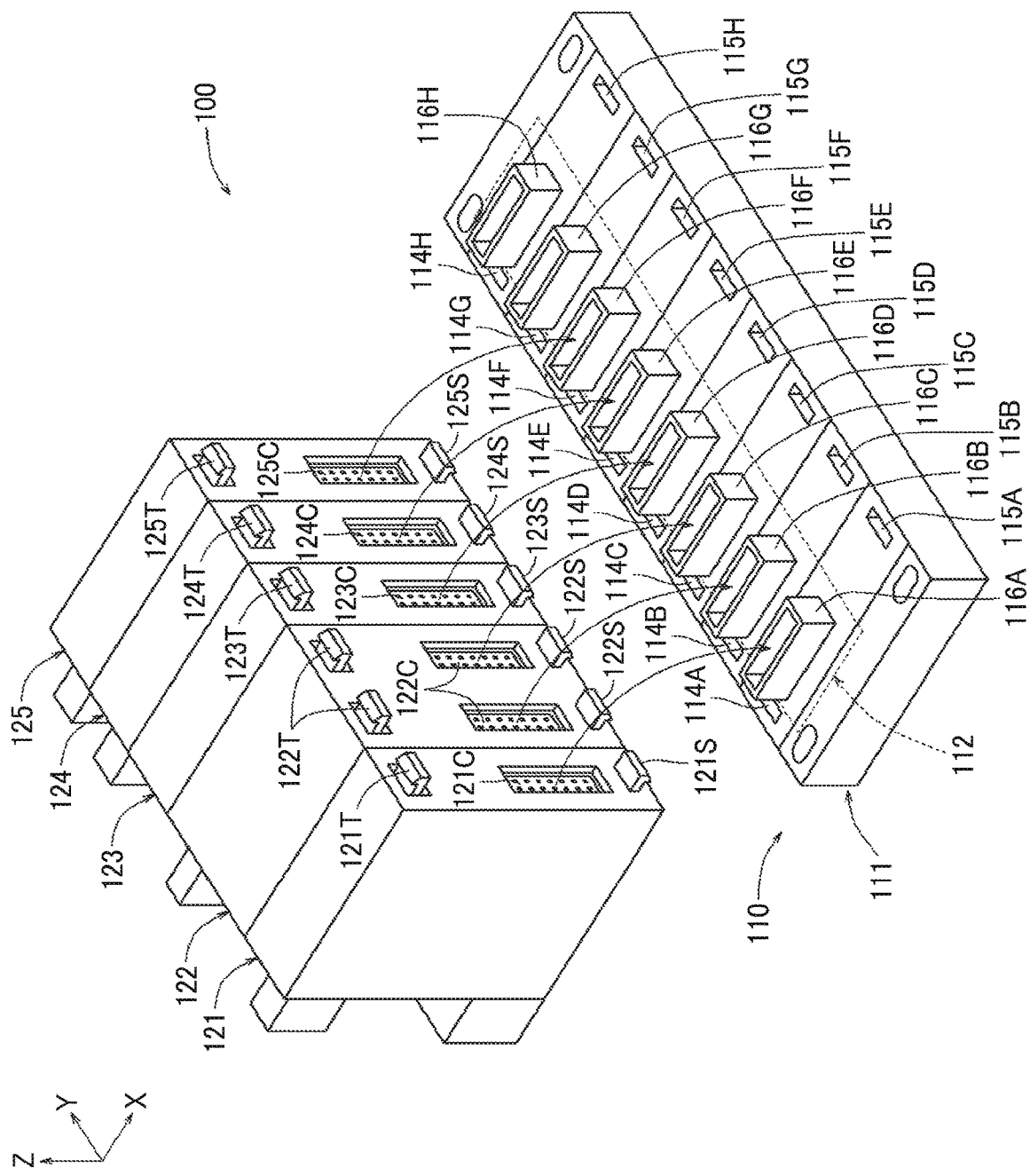
FIG. 1 is a diagram for describing an example of an appearance of a programmable logic controller (PLC) to which a power supply monitoring apparatus of the present invention is applied.

An embodiment of the present invention is described below in sequence with reference to the drawings. FIG. 1 illustrates an example of an appearance of a PLC 100 including a control module 122 to which a power supply monitoring apparatus described later is applied. The PLC 100 illustrated in the example of FIG. 1 includes a base unit 110, a power supply module 121, the control module 122, a communication module 123, an input module 124, and an output module 125.

As illustrated in FIG. 1, the base unit 110 includes a base 111, a printed circuit board 112, and slot connectors 116A to 116H. The base 111 is formed into a plate shape from an insulating resin or the like. The slot connectors 116A to 116H are mounted on the printed circuit board 112. The printed circuit board 112 is provided on the base 111 so that the slot connectors 116A to 116H are oriented upward. The base 111 is provided with first attachment holes 114A to 114H and second attachment holes 115A to 115H for assisting support of the modules mounted in a removable manner. For example, the power supply module 121 is mounted on the base unit 110 by fitting a module connector 121C of the power supply module 121 to the slot connector 116A. Then, the power supply module 121 is fixed to the base unit 110 by engaging a first engagement claw 121S of the power supply module 121 with the first attachment hole 114A and engaging a second engagement claw 121T with the second attachment hole 115A. The slot connector 116A is dedicated to the power supply module 121.

The power supply module 121 supplies electric power to each module mounted on the base unit 110. The power supply module 121 has the module connector 121C, the first engagement claw 121S, the second engagement claw 121T, and the like. The power supply module 121 is attached to the slot connector 116A, the first attachment hole 114A, and the second attachment hole 115A of the base unit 110. For example, the power supply module 121 is supplied with a power supply voltage of 24 [V] from an external power supply (not illustrated), and supplies a power supply voltage of 3.3 [V] to each module mounted on the base unit 110.

The control module 122 acquires input information from each module mounted on the base unit 110, and generates output information. The control module 122 has module connectors 122C, first engagement claws 122S, second engagement claws 122T, and the like. In the example of FIG. 1, the control module 122 is attached to the slot connectors 116B and 116C, the first attachment holes 114B and 114C, and the second attachment holes 115B and 115C of the base unit 110. For example, the control module 122 communicates with other devices via the communication module 123 on a local area network (LAN), acquires reception information received by the communication module 123, generates reply information, and causes the communication module 123 to transmit the generated reply information. For example, the control module 122 acquires input information that is input to the input module 124, generates output information, and causes the output module 125 to output the generated output information.

For example, the communication module 123 is a module to which a LAN cable is connected, and that communicates with other devices connected to the LAN. The communication module 123 has a module connector 123C, a first engagement claw 123S, a second engagement claw 123T, and the like. In the example of FIG. 1, the communication module 123 is attached to the slot connector 116D, the first attachment hole 114D, and the second attachment hole 115D of the base unit 110. The control module 122 can transmit and receive information to and from each device connected to the LAN via the communication module 123 and the LAN cable connected to the communication module 123.

The input module 124 acquires a signal (input information) from each external input device (for example, a stop button or a start button). The input module 124 has a module connector 124C, a first engagement claw 124S, a second engagement claw 124T, and the like. In the example of FIG. 1, the input module 124 is attached to the slot connector 116E, the first attachment hole 114E, and the second attachment hole 115E of the base unit 110. The control module 122 can acquire the input information from each external input device via the input module 124.

The output module 125 outputs a signal (output information) to each external output device (for example, a motor of a machine tool or a motor for opening or closing a safety door on the periphery). The output module 125 has a module connector 125C, a first engagement claw 125S, a second engagement claw 125T, and the like. In the example of FIG. 1, the output module 125 is attached to the slot connector 116F, the first attachment hole 114F, and the second attachment hole 115F of the base unit 110. The control module 122 can output the output information to each external output device via the output module 125.

In the description of this embodiment, it is assumed in the example of FIG. 1 that the power supply module 121 is intended for a general PLC and the communication module 123, the input module 124, and the output module 125 are also intended for the general PLC. In the example of FIG. 1, it is assumed that the control module 122 is intended for a safety PLC instead of the general PLC. In this case, the control module 122 for the safety PLC is provided with dual-system controllers that are CPUs, and with the power supply monitoring apparatus configured to monitor electric power to be supplied to the controllers. The power supply monitoring apparatus provided for the safety PLC requires self-diagnosis. Detailed description is given below of circuit blocks of the controllers and the power supply monitoring apparatus in the control module 122 and self-diagnosis performed by the controllers.

Figure 2:
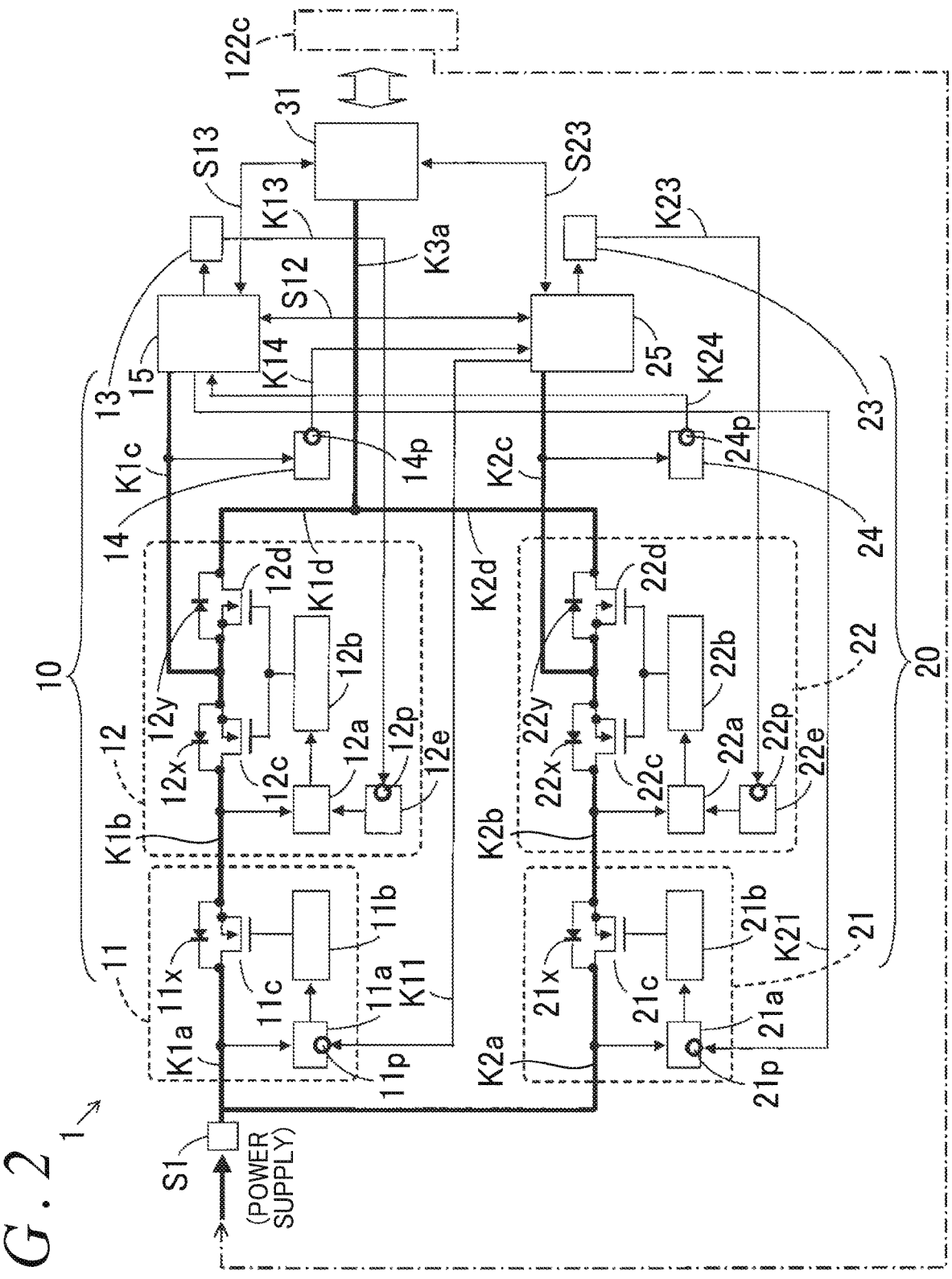
FIG. 2 is a circuit block diagram illustrating the configuration of the power supply monitoring apparatus applied in a control module.

FIG. 2 is a circuit block diagram of a power supply monitoring apparatus 1 provided in the control module 122. The power supply monitoring apparatus 1 supplies or interrupts electric power to a first controller 15 (first CPU) and a second controller 25 (second CPU) constructed in the dual system, and to a peripheral circuit 31. If a power supplying and interrupting device configured to supply or interrupt electric power to the first controller 15 and a power supplying and interrupting device configured to supply or interrupt electric power to the second controller 25 are provided as a common power supplying and interrupting device, both the first controller 15 and the second controller 25 are stopped during self-diagnosis of interruption. Therefore, the self-diagnosis of interruption cannot be performed. In view of this, a first power supplying and interrupting device 10 and a second power supplying and interrupting device 20 are constructed in the dual system. The first power supplying and interrupting device 10 supplies or interrupts electric power to the first controller 15. The second power supplying and interrupting device 20 supplies or interrupts electric power to the second controller 25. The second controller 25 performs self-diagnosis of the first power supplying and interrupting device 10. The first controller 15 performs self-diagnosis of the second power supplying and interrupting device 20.

The power supply monitoring apparatus 1 illustrated in FIG. 2 is supplied with a power supply voltage of, for example, 3.3 [V] from the power supply module 121 (see FIG. 1) to a power supply terminal S1 via the module connectors 122C (see FIG. 1). The first controller 15 is supplied with electric power from the power supply terminal S1 via first power supply paths K1$a$, K1$b$, and K1$c$. The second controller 25 is supplied with electric power from the power supply terminal S1 via second power supply paths K2$a$, K2$b$, and K2$c$. The peripheral circuit 31 is supplied with electric power from the power supply terminal S1 via the first power supply paths K1$a$, K1$b$, and K1$c$ and common power supply paths K1$d$ and K3$a$, and via the second power supply paths K2$a$, K2$b$, and K2$c$ and common power supply paths K2$d$ and K3$a$.

The first power supplying and interrupting device 10 is provided in the first power supply paths K1$a$, K1$b$, and K1$c$ from the power supply terminal S1 to the first controller 15. The first power supplying and interrupting device 10 can switch a connected state and an interrupted state depending on the electric power supplied from the power supply. The second power supplying and interrupting device 20 is provided in the second power supply paths K2$a$, K2$b$, and K2$c$ from the power supply terminal S1 to the second controller 25. The second power supplying and interrupting device 20 can switch a connected state and an interrupted state depending on the electric power supplied from the power supply.

The first power supplying and interrupting device 10 includes a first preceding switching circuit 11, a first succeeding switching circuit 12, a first monitoring circuit 13, and a first status monitoring circuit 14. The first controller 15 and the second controller 25 are constructed in the dual system. The first power supplying and interrupting device 10 configured to supply electric power to the first controller 15 and the second power supplying and interrupting device 20 configured to supply electric power to the second controller 25 are constructed in the dual system.

The first preceding switching circuit 11 is provided on the power supply side (power supply terminal S1 side) in the first power supply paths K1$a$ to K1$c$. The first preceding switching circuit 11 includes a reference voltage setting circuit 11$a$, a power supply monitoring circuit 11$b$, and a switching device 11$c$. For example, the switching device 11$c$ is a metal oxide semiconductor field-effect transistor (MOSFET). When the switching device 11$c$ is energized by the power supply monitoring circuit 11$b$, the switching device 11$c$ brings the first power supply path K1$a$ and the first power supply path K1$b$ into a short-circuited state (that is, the connected state). When the switching device 11$c$ is deenergized by the power supply monitoring circuit 11$b$, the switching device 11$c$ brings the first power supply path K1$a$ and the first power supply path K1$b$ into an open state (that is, the interrupted state). When the switching device 11$c$ is deenergized, the first power supply path K1$a$ and the first power supply path K1$b$ are connected by a diode 11$x$. However, the direction of the diode 11$x$ is set so that no current flows in a direction from the first power supply path K1$a$ to the first power supply path K1$b$.

A voltage is input from the first power supply path K1$a$ to the reference voltage setting circuit 11$a$, and a control signal is input from the second controller 25 to the reference voltage setting circuit 11$a$ via a path K11. When a connection request signal is input from the second controller 25 via the path K11 and when the power supply voltage supplied to the first power supply path K1a is lower than a permissible lower limit voltage or higher than a permissible upper limit voltage, the reference voltage setting circuit 11a outputs an interruption request signal to the power supply monitoring circuit 11b. When the connection request signal is input from the second controller 25 via the path K11 and when the power supply voltage supplied to the first power supply path K1a is equal to or higher than the permissible lower limit voltage and equal to or lower than the permissible upper limit voltage, the reference voltage setting circuit 11a outputs the connection request signal to the power supply monitoring circuit 11b. When the interruption request signal is input from the second controller 25 via the path K11, the reference voltage setting circuit 11a outputs the interruption request signal to the power supply monitoring circuit 11b irrespective of the power supply voltage supplied to the first power supply path K1a.

When the connection request signal is input from the reference voltage setting circuit 11a, the power supply monitoring circuit 11b energizes the switching device 11c. When the interruption request signal is input from the reference voltage setting circuit 11a, the power supply monitoring circuit 11b deenergizes the switching device 11c. In a default setting when the power supply is turned ON, the connection request signal is input from the second controller 25 to the reference voltage setting circuit 11a.

The first succeeding switching circuit 12 is provided on the first controller 15 side in the first power supply paths K1a to K1c. The first succeeding switching circuit 12 includes a reference voltage setting circuit 12a, a power supply monitoring circuit 12b, switching devices 12c and 12d, and a power interruption keeping circuit 12e. For example, the switching devices 12c and 12d are MOSFETs. When the switching devices 12c and 12d are energized by the power supply monitoring circuit 12b, the switching devices 12c and 12d bring the first power supply path K1b and the first power supply path K1c into a short-circuited state (that is, the connected state) and the first power supply path K1c and the common power supply path K1d into a short-circuited state (that is, the connected state), respectively. When the switching devices 12c and 12d are deenergized by the power supply monitoring circuit 12b, the switching devices 12c and 12d bring the first power supply path K1b and the first power supply path K1c into an open state (that is, the interrupted state) and the first power supply path K1c and the common power supply path K1d into an open state (that is, the interrupted state), respectively. When the switching device 12c is deenergized, the first power supply path K1b and the first power supply path K1c are connected by a diode 12x. However, the direction of the diode 12x is set so that no current flows in a direction from the first power supply path K1b to the first power supply path K1c. When the switching device 12d is deenergized, the first power supply path K1c and the common power supply path K1d are connected by a diode 12y. However, the direction of the diode 12y is set so that no current flows in a direction from the common power supply path K1d to the first power supply path K1c.

A voltage is input from the first power supply path K1b to the reference voltage setting circuit 12a, and a control signal is input from the power interruption keeping circuit 12e to the reference voltage setting circuit 12a. When a connection request signal is input from the power interruption keeping circuit 12e and when the power supply voltage supplied to the first power supply path K1b is lower than a permissible lower limit voltage or higher than a permissible upper limit voltage, the reference voltage setting circuit 12a outputs an interruption request signal to the power supply monitoring circuit 12b. When the connection request signal is input from the power interruption keeping circuit 12e and when the power supply voltage supplied to the first power supply path K1b is equal to or higher than the permissible lower limit voltage and equal to or lower than the permissible upper limit voltage, the reference voltage setting circuit 12a outputs the connection request signal to the power supply monitoring circuit 12b. When the interruption request signal is input from the power interruption keeping circuit 12e, the reference voltage setting circuit 12a outputs the interruption request signal to the power supply monitoring circuit 12b irrespective of the power supply voltage supplied to the first power supply path K1b.

When the connection request signal is input from the reference voltage setting circuit 12a, the power supply monitoring circuit 12b energizes the switching devices 12c and 12d. When the interruption request signal is input from the reference voltage setting circuit 12a, the power supply monitoring circuit 12b deenergizes the switching devices 12c and 12d. In the default setting when the power supply is turned ON, the connection request signal is input from the power interruption keeping circuit 12e to the reference voltage setting circuit 12a.

A control signal is input from the first monitoring circuit 13 to the power interruption keeping circuit 12e via a path K13. The power interruption keeping circuit 12e outputs the connection request signal to the reference voltage setting circuit 12a when the power supply is turned ON, keeps the currently output signal when the connection request signal is input from the first monitoring circuit 13 via the path K13, and outputs the interruption request signal to the reference voltage setting circuit 12a when the interruption request signal is input from the first monitoring circuit 13. The power interruption keeping circuit 12e is a so-called latch circuit. The power interruption keeping circuit 12e outputs the connection request signal to the reference voltage setting circuit 12a by default. Once the interruption request signal is output, the power interruption keeping circuit 12e keeps outputting the interruption request signal until the power supply is turned OFF.

The first monitoring circuit 13 monitors an operation of the first controller 15, and outputs the interruption request signal to the power interruption keeping circuit 12e via the path K13 when an abnormal state of the operation of the first controller 15 continues for a predetermined time (for example, continues for several tens of milliseconds). The first monitoring circuit 13 outputs the connection request signal to the power interruption keeping circuit 12e via the path K13 when the operation of the first controller 15 is normal or until the predetermined time elapses from a timing when the operation of the first controller 15 is abnormal. For example, the first controller 15 outputs a pulse to the first monitoring circuit 13. The pulse periodically has a High level and a Low level that are switched repeatedly. When the pulse is input continuously, the first monitoring circuit 13 determines that the operation of the first controller 15 is normal. When the pulse is stopped (fixed at the High level or the Low level), the first monitoring circuit 13 determines that the operation of the first controller 15 is abnormal.

The first status monitoring circuit 14 outputs a signal to the second controller 25 via a path K14 depending on the power supply voltage supplied to the first controller 15 via the first power supply path K1c. For example, when electric power is supplied from the power supply terminal S1 to the first power supply path K1c, the first status monitoring circuit 14 outputs a power supply signal (for example, the High level) to the second controller 25 via the path K14. When electric power is not supplied (interrupted) from the power supply terminal S1 to the first power supply path K1c, the first status monitoring circuit 14 outputs a power interruption signal (for example, the Low level) to the second controller 25 via the path K14.

Electric power supplied to the power supply terminal S1 is supplied to the first controller 15 via the first power supply path K1a, the switching device 11c, the first power supply path K1b, the switching device 12c, and the first power supply path K1c. A signal is input from a second status monitoring circuit 24 to the first controller 15 depending on the power supply voltage supplied to the second controller 25 via the second power supply path K2c. The first controller 15 outputs an operation checking pulse signal to the first monitoring circuit 13, and a control signal to a reference voltage setting circuit 21a of a second preceding switching circuit 21. The second status monitoring circuit 24 and the reference voltage setting circuit 21a are described later. A communication circuit S12 (communication line) is connected to the first controller 15 for transmission and reception of information to and from the second controller 25. A circuit S13 (line) is connected to the first controller 15 for exchange of various types of information with the peripheral circuit 31.

The second power supplying and interrupting device 20 includes the second preceding switching circuit 21, a second succeeding switching circuit 22, a second monitoring circuit 23, and the second status monitoring circuit 24. The first controller 15 and the second controller 25 are constructed in the dual system. The first power supplying and interrupting device 10 configured to supply electric power to the first controller 15 and the second power supplying and interrupting device 20 configured to supply electric power to the second controller 25 are constructed in the dual system.

The second preceding switching circuit 21 is provided on the power supply side (power supply terminal S1 side) in the second power supply paths K2a to K2c. The second preceding switching circuit 21 includes the reference voltage setting circuit 21a, a power supply monitoring circuit 21b, and a switching device 21c. For example, the switching device 21c is a MOSFET. When the switching device 21c is energized by the power supply monitoring circuit 21b, the switching device 21c brings the second power supply path K2a and the second power supply path K2b into a short-circuited state (that is, the connected state). When the switching device 21c is deenergized by the power supply monitoring circuit 21b, the switching device 21c brings the second power supply path K2a and the second power supply path K2b into an open state (that is, the interrupted state). When the switching device 21c is deenergized, the second power supply path K2a and the second power supply path K2b are connected by a diode 21x. However, the direction of the diode 21x is set so that no current flows in a direction from the second power supply path K2a to the second power supply path K2b.

A voltage is input from the second power supply path K2a to the reference voltage setting circuit 21a, and a control signal is input from the first controller 15 to the reference voltage setting circuit 21a via a path K21. When a connection request signal is input from the first controller 15 via the path K21 and when the power supply voltage supplied to the second power supply path K2a is lower than a permissible lower limit voltage or higher than a permissible upper limit voltage, the reference voltage setting circuit 21a outputs an interruption request signal to the power supply monitoring circuit 21b. When the connection request signal is input from the first controller 15 via the path K21 and when the power supply voltage supplied to the second power supply path K2a is equal to or higher than the permissible lower limit voltage and equal to or lower than the permissible upper limit voltage, the reference voltage setting circuit 21a outputs the connection request signal to the power supply monitoring circuit 21b. When the interruption request signal is input from the first controller 15 via the path K21, the reference voltage setting circuit 21a outputs the interruption request signal to the power supply monitoring circuit 21b irrespective of the power supply voltage supplied to the second power supply path K2a.

When the connection request signal is input from the reference voltage setting circuit 21a, the power supply monitoring circuit 21b energizes the switching device 21c. When the interruption request signal is input from the reference voltage setting circuit 21a, the power supply monitoring circuit 21b deenergizes the switching device 21c. In the default setting when the power supply is turned ON, the connection request signal is input from the first controller 15 to the reference voltage setting circuit 21a.

The second succeeding switching circuit 22 is provided on the second controller 25 side in the second power supply paths K2a to K2c. The second succeeding switching circuit 22 includes a reference voltage setting circuit 22a, a power supply monitoring circuit 22b, switching devices 22c and 22d, and a power interruption keeping circuit 22e. For example, the switching devices 22c and 22d are MOSFETs. When the switching devices 22c and 22d are energized by the power supply monitoring circuit 22b, the switching devices 22c and 22d bring the second power supply path K2b and the second power supply path K2c into a short-circuited state (that is, the connected state) and the second power supply path K2c and the common power supply path K2d into a short-circuited state (that is, the connected state), respectively. When the switching devices 22c and 22d are deenergized by the power supply monitoring circuit 22b, the switching devices 22c and 22d bring the second power supply path K2b and the second power supply path K2c into an open state (that is, the interrupted state) and the second power supply path K2c and the common power supply path K2d into an open state (that is, the interrupted state), respectively. When the switching device 22c is deenergized, the second power supply path K2b and the second power supply path K2c are connected by a diode 22x. However, the direction of the diode 22x is set so that no current flows in a direction from the second power supply path K2b to the second power supply path K2c. When the switching device 22d is deenergized, the second power supply path K2c and the common power supply path K2d are connected by a diode 22y. However, the direction of the diode 22y is set so that no current flows in a direction from the common power supply path K2d to the second power supply path K2c.

A voltage is input from the second power supply path K2b to the reference voltage setting circuit 22a, and a control signal is input from the power interruption keeping circuit 22e to the reference voltage setting circuit 22a. When a connection request signal is input from the power interruption keeping circuit 22e and when the power supply voltage supplied to the second power supply path K2b is lower than a permissible lower limit voltage or higher than a permissible upper limit voltage, the reference voltage setting circuit 22a outputs an interruption request signal to the power supply monitoring circuit 22b. When the connection request signal is input from the power interruption keeping circuit 22e and when the power supply voltage supplied to the second power supply path K2b is equal to or higher than the permissible lower limit voltage and equal to or lower than the permissible upper limit voltage, the reference voltage setting circuit 22a outputs the connection request signal to the power supply monitoring circuit 22b. When the interruption request signal is input from the power interruption keeping circuit 22e, the reference voltage setting circuit 22a outputs the interruption request signal to the power supply monitoring circuit 22b irrespective of the power supply voltage supplied to the second power supply path K2b.

When the connection request signal is input from the reference voltage setting circuit 22a, the power supply monitoring circuit 22b energizes the switching devices 22c and 22d. When the interruption request signal is input from the reference voltage setting circuit 22a, the power supply monitoring circuit 22b deenergizes the switching devices 22c and 22d. In the default setting when the power supply is turned ON, the connection request signal is input from the power interruption keeping circuit 22e to the reference voltage setting circuit 22a.

A control signal is input from the second monitoring circuit 23 to the power interruption keeping circuit 22e via a path K23. The power interruption keeping circuit 22e outputs the connection request signal to the reference voltage setting circuit 22a when the power supply is turned ON, keeps the currently output signal when the connection request signal is input from the second monitoring circuit 23 via the path K23, and outputs the interruption request signal to the reference voltage setting circuit 22a when the interruption request signal is input from the second monitoring circuit 23. The power interruption keeping circuit 22e is a so-called latch circuit. The power interruption keeping circuit 22e outputs the connection request signal to the reference voltage setting circuit 22a by default. Once the interruption request signal is output, the power interruption keeping circuit 22e keeps outputting the interruption request signal until the power supply is turned OFF.

The second monitoring circuit 23 monitors an operation of the second controller 25, and outputs the interruption request signal to the power interruption keeping circuit 22e via the path K23 when an abnormal state of the operation of the second controller 25 continues for a predetermined time (for example, continues for several tens of milliseconds). The second monitoring circuit 23 outputs the connection request signal to the power interruption keeping circuit 22e via the path K23 when the operation of the second controller 25 is normal or until the predetermined time elapses from a timing when the operation of the second controller 25 is abnormal. For example, the second controller 25 outputs a pulse to the second monitoring circuit 23. The pulse periodically has a High level and a Low level that are switched repeatedly. When the pulse is input continuously, the second monitoring circuit 23 determines that the operation of the second controller 25 is normal. When the pulse is stopped (fixed at the High level or the Low level), the second monitoring circuit 23 determines that the operation of the second controller 25 is abnormal.

The second status monitoring circuit 24 outputs a signal to the first controller 15 via a path K24 depending on the power supply voltage supplied to the second controller 25 via the second power supply path K2c. For example, when electric power is supplied from the power supply terminal S1 to the second power supply path K2c, the second status monitoring circuit 24 outputs a power supply signal (for example, the High level) to the first controller 15 via the path K24. When electric power is not supplied (interrupted) from the power supply terminal S1 to the second power supply path K2c, the second status monitoring circuit 24 outputs a power interruption signal (for example, the Low level) to the first controller 15 via the path K24.

Electric power supplied to the power supply terminal S1 is supplied to the second controller 25 via the second power supply path K2a, the switching device 21c, the second power supply path K2b, the switching device 22c, and the second power supply path K2c. A signal is input from the first status monitoring circuit 14 to the second controller 25 depending on the power supply voltage supplied to the first controller 15 via the first power supply path K1c. The second controller 25 outputs an operation checking pulse signal to the second monitoring circuit 23, and a control signal to the reference voltage setting circuit 11a of the first preceding switching circuit 11. The first status monitoring circuit 14 and the reference voltage setting circuit 11a are described above. The communication circuit S12 (communication line) is connected to the second controller 25 for transmission and reception of information to and from the first controller 15. A circuit S23 (line) is connected to the second controller 25 for exchange of various types of information with the peripheral circuit 31.

The peripheral circuit 31 illustrated in FIG. 2 is a general circuit that is excluded from targets of functional safety. Examples of the peripheral circuit 31 include a communication circuit to be used for the first controller 15 and the second controller 25 to transmit and receive information to and from another module (such as the input module 124) via the module connectors 122C, and a flash memory configured to store log information.

A photonic device is provided in a path directly connecting a device supplied with electric power through the first power supply path K1a, K1b, or K1c and a device supplied with electric power through the second power supply path K2a, K2b, or K2c. The photonic device transmits a signal while electrically insulating an input side from an output side. For example, the photonic device is a photocoupler, which prevents a current from straying from the device on the first power supply path side into the second power supply path, from the device on the second power supply path side into the first power supply path, and in other ways.

For example, as illustrated in FIG. 2, a photonic device 14p is provided in the path K14 from the first status monitoring circuit 14 to the second controller 25. A photonic device 24p is provided in the path K24 from the second status monitoring circuit 24 to the first controller 15. A photonic device 21p is provided in the path K21 from the first controller 15 to the second preceding switching circuit 21. A photonic device 11p is provided in the path K11 from the second controller 25 to the first preceding switching circuit 11. A photonic device 12p is provided in the path K13 from the first monitoring circuit 13 to the first succeeding switching circuit 12. A photonic device 22p is provided in the path K23 from the second monitoring circuit 23 to the second succeeding switching circuit 22.

Next, processing procedures of the self-diagnosis (inspection) of the first power supplying and interrupting device 10 and the second power supplying and interrupting device 20 by the first controller 15 and the second controller 25 are described with reference to FIG. 3A to FIG. 5. The self-diagnosis (inspection) of the first power supplying and interrupting device 10 requires that the first power supplying and interrupting device 10 be brought into the interrupted state. At this time, the first controller 15 is not supplied with electric power. Therefore, the self-diagnosis is performed by using the second controller 25. Similarly, the self-diagnosis (inspection) of the second power supplying and interrupting device 20 requires that the second power supplying and interrupting device 20 be brought into the interrupted state. At this time, the second controller 25 is not supplied with electric power. Therefore, the self-diagnosis is performed by using the first controller 15. When the power supply is turned ON, the first controller 15 advances the processing to Step S110 of FIG. 3A. When the power supply is turned ON, the second controller 25 advances the processing to Step S210 of FIG. 3C. The steps of the first controller 15 are first described below, and then the steps of the second controller 25 are described.

In Step S110, the first controller 15 executes initial processing, and advances the processing to Step S115. For example, the initial processing involves setting the type and speed of communication with the second controller 25, and outputting the connection request signal to the reference voltage setting circuit 21a.

In Step S115, the first controller 15 transmits, to the second controller 25, first inspection result request information for requesting a result of the inspection of the first power supplying and interrupting device 10 (Transmission 1-1), and advances the processing to Step S120.

In Step S120, the first controller 15 determines whether second inspection result request information is received from the second controller 25. When the second inspection result request information is received (Yes), the first controller 15 advances the processing to Step S125. When the second inspection result request information is not received (No), the first controller 15 advances the processing to Step S130. The second inspection result request information is transmitted from the second controller 25 in Step S215 of the processing performed by the second controller 25 started by turning ON the power supply (Transmission 2-1).

When the processing is advanced to Step S125, the first controller 15 transmits first inspection result response information (Response 1-1), and advances the processing to Step S130. In Step S125, the first controller 15 has not inspected (not performed the self-diagnosis of) the second power supplying and interrupting device 20 yet. Therefore, the first controller 15 transmits first inspection result response information including "uninspected".

When the processing is advanced to Step S130, the first controller 15 determines whether second inspection result response information is received from the second controller 25. When the second inspection result response information is received (Yes), the first controller 15 advances the processing to Step S135. When the second inspection result response information is not received (No), the first controller 15 returns the processing to Step S120. The second inspection result response information is transmitted from the second controller 25 in Step S225 or Step S270 of the processing performed by the second controller 25.

When the processing is advanced to Step S135, the first controller 15 determines whether the received second inspection result response information is "uninspected". When the received second inspection result response information is "uninspected" (Yes), the first controller 15 advances the processing to Step S140. When the received second inspection result response information is not "uninspected" (No), the first controller 15 advances the processing to Step S170. Specifically, the first controller 15 advances the processing to Step S140 when the received second inspection result response information is a response in Step S225 of the second controller 25 (Response 2-1), and advances the processing to Step S170 when the received second inspection result response information is a response in Step S270 of the second controller 25 (Response 2-2).

When the processing is advanced to Step S140, the first controller 15 inspects (performs the self-diagnosis of) an operation of switching the connected state and the interrupted state by the second power supplying and interrupting device 20 in Processing SA100 described later, and advances the processing to Step S145. In Processing SA100, the first controller 15 transmits predetermined information to the second controller 25 (Transmission 1-2), performs various types of inspection for the second power supplying and interrupting device 20, and then restarts the second controller 25. Details of Processing SA100 are described later.

In Step S145, the first controller 15 determines whether the result of the inspection of the second power supplying and interrupting device 20 in Step S140 is normal. When the result is normal (Yes), the first controller 15 advances the processing to Step S150. When the result is not normal (No), the first controller 15 advances to first abnormal-case control prepared in advance. For example, in the first abnormal-case control, the first controller 15 outputs a notification that an abnormality occurs, and outputs, to the output module 125 (see FIG. 1), output information for stopping the apparatus more safely.

When the processing is advanced to Step S150, the first controller 15 determines whether the second inspection result request information is received from the second controller 25. When the second inspection result request information is received (Yes), the first controller 15 advances the processing to Step S155. When the second inspection result request information is not received (No), the first controller 15 returns the processing to Step S150. The second inspection result request information is transmitted from the second controller 25 in Step S215 of the processing performed by the second controller 25 restarted through the inspection in Step S140 (Transmission 2-1).

When the processing is advanced to Step S155, the first controller 15 transmits (makes a response), to the second controller 25, first inspection result response information including "inspected" indicating that the second power supplying and interrupting device 20 is inspected, and "normal" indicating that the result of the inspection is normal, and advances the processing to Step S160.

In Step S160, the first controller 15 waits for the inspection (self-diagnosis) of the first power supplying and interrupting device 10 by the second controller 25 in Processing SA200 described later, and returns the processing to Step S160. While the first controller 15 is waiting in Step S160, the second controller 25 inspects the first power supplying and interrupting device 10, and restarts the first controller 15. Therefore, the first controller 15 returns the processing to Step S110.

When the processing is advanced to Step S170, the first controller 15 determines whether the received second inspection result response information includes "inspected" and "normal". When the received second inspection result response information includes "inspected" and "normal" (Yes), the first controller 15 advances to first normal-case control prepared in advance. When the received second inspection result response information does not include "inspected" and "normal" (No), the first controller 15 advances to the first abnormal-case control prepared in advance. For example, in the first normal-case control, the first controller 15 outputs, to the output module 125 (see FIG. 1), output information generated based on input information from the input module 124 (see FIG. 1). As described above, the first abnormal-case control involves, for example, outputting the notification that an abnormality occurs, and outputting, to the output module 125 (see FIG. 1), the output information for stopping the apparatus more safely.

As described above, the first controller 15 includes a first start distinguishing step (Steps S115 to S135) of distinguishing, when the first controller 15 is started, whether the first controller 15 is currently started by turning ON the power supply or by inspecting the first power supplying and interrupting device 10 through transmission and reception of information to and from the second controller 25.

The first controller 15 includes a first power-supply-start step (Steps S140 to S160) of inspecting the second power supplying and interrupting device 20 when the first controller 15 is started by turning ON the power supply, restarting the second controller 25 when the second power supplying and interrupting device 20 is normal, transmitting the first inspection result response information when the second inspection result request information is received from the second controller 25, and waiting for the inspection of the first power supplying and interrupting device 10 by the second controller 25.

The first controller 15 includes a first inspection-start step of transmitting the first inspection result request information to the second controller 25 and receiving the second inspection result response information when the first controller 15 is started by inspecting the first power supplying and interrupting device 10 (Steps S115 to S130), and advancing to the first normal-case control, which is prepared for a case where the first controller 15 is normal, when the second inspection result response information includes "normal" (when the result of the inspection is normal) (Steps S135 and S170).

In Step S210, the second controller 25 executes initial processing, and advances the processing to Step S215. For example, the initial processing involves setting the type and speed of communication with the first controller 15, and outputting the connection request signal to the reference voltage setting circuit 11a.

In Step S215, the second controller 25 transmits, to the first controller 15, the second inspection result request information for requesting a result of the inspection of the second power supplying and interrupting device 20 (Transmission 2-1), and advances the processing to Step S220.

In Step S220, the second controller 25 determines whether the first inspection result request information is received from the first controller 15. When the first inspection result request information is received (Yes), the second controller 25 advances the processing to Step S225. When the first inspection result request information is not received (No), the second controller 25 advances the processing to Step S230. The first inspection result request information is transmitted from the first controller 15 in Step S115 of the processing performed by the first controller 15 started by turning ON the power supply (Transmission 1-1).

When the processing is advanced to Step S225, the second controller 25 transmits the second inspection result response information (Response 2-1), and advances the processing to Step S230. In Step S225, the second controller 25 has not inspected (not performed the self-diagnosis of) the first power supplying and interrupting device 10 yet. Therefore, the second controller 25 transmits second inspection result response information including "uninspected".

When the processing is advanced to Step S230, the second controller 25 determines whether the first inspection result response information is received from the first controller 15. When the first inspection result response information is received (Yes), the second controller 25 advances the processing to Step S235. When the first inspection result response information is not received (No), the second controller 25 returns the processing to Step S220. The first inspection result response information is transmitted from the first controller 15 in Step S125 or Step S155 of the processing performed by the first controller 15.

When the processing is advanced to Step S235, the second controller 25 determines whether the received first inspection result response information is "uninspected". When the received first inspection result response information is "uninspected" (Yes), the second controller 25 advances the processing to Step S240. When the received first inspection result response information is not "uninspected" (No), the second controller 25 advances the processing to Step S245. Specifically, the second controller 25 advances the processing to Step S240 when the received first inspection result response information is a response in Step S125 of the first controller 15 (Response 1-1), and advances the processing to Step S245 when the received first inspection result response information is a response in Step S155 of the first controller 15 (Response 1-2).

When the processing is advanced to Step S240, the second controller 25 waits for the inspection (self-diagnosis) of the second power supplying and interrupting device 20 by the first controller 15 in Processing SB200 described later, and returns the processing to Step S240. While the second controller 25 is waiting in Step S240, the first controller 15 inspects the second power supplying and interrupting device 20, and restarts the second controller 25. Therefore, the second controller 25 returns the processing to Step S210.

When the processing is advanced to Step S245, the second controller 25 determines whether the received first inspection result response information includes "inspected" and "normal". When the received first inspection result response information includes "inspected" and "normal" (Yes), the second controller 25 advances the processing to Step S250. When the received first inspection result response information does not include "inspected" and "normal" (No), the second controller 25 advances to second abnormal-case control prepared in advance. For example, the second abnormal-case control involves outputting a notification that an abnormality occurs, and outputting, to the output module 125 (see FIG. 1), output information for stopping the apparatus more safely.

When the processing is advanced to Step S250, the second controller 25 inspects (performs the self-diagnosis of) an operation of switching the connected state and the interrupted state by the first power supplying and interrupting device 10 in Processing SB100 described later, and advances the processing to Step S255. In Processing SB100, the second controller 25 transmits predetermined information to the first controller 15 (Transmission 2-2), performs various types of inspection for the first power supplying and interrupting device 10, and then restarts the first controller 15. Details of Processing SB100 are described later.

In Step S255, the second controller 25 determines whether the result of the inspection of the first power supplying and interrupting device 10 in Step S250 is normal. When the result is normal (Yes), the second controller 25 advances the processing to Step S260. When the result is not normal (No), the second controller 25 advances to the second abnormal-case control prepared in advance. As described above, in the second abnormal-case control, for example, the second controller 25 outputs the notification that an abnormality occurs, and outputs, to the output module 125 (see FIG. 1), the output information for stopping the apparatus more safely.

When the processing is advanced to Step S260, the second controller 25 determines whether the first inspection result request information is received from the first controller 15.

When the first inspection result request information is received (Yes), the second controller 25 advances the processing to Step S270. When the first inspection result request information is not received (No), the second controller 25 returns the processing to Step S260. The first inspection result request information is transmitted from the first controller 15 in Step S115 of the processing performed by the first controller 15 restarted through the inspection in Step S250 (Transmission 1-1).

When the processing is advanced to Step S270, the second controller 25 transmits (makes a response), to the first controller 15, second inspection result response information including "inspected" indicating that the first power supplying and interrupting device 10 is inspected and "normal" indicating that the result of the inspection is normal, and advances to second normal-case control prepared in advance. For example, in the second normal-case control, the second controller 25 outputs, to the output module 125 (see FIG. 1), output information generated based on input information from the input module 124 (see FIG. 1).

As described above, the second controller 25 includes a second start distinguishing step (Steps S215 to S235) of distinguishing, when the second controller 25 is started, whether the second controller 25 is currently started by turning ON the power supply or by inspecting the second power supplying and interrupting device 20 through transmission and reception of information to and from the first controller 15.

The second controller 25 includes a second power-supply-start step (Step S240) of waiting for the inspection of the second power supplying and interrupting device 20 by the first controller 15 when the second controller 25 is started by turning ON the power supply.

The second controller 25 includes a second inspection-start step of transmitting the second inspection result request information to the first controller 15 and receiving the first inspection result response information when the second controller 25 is started by inspecting the second power supplying and interrupting device 20 (Steps S215 to S230), inspecting the first power supplying and interrupting device 10 when the first inspection result response information includes "normal" (when the result of the inspection is normal) (Steps S245 and S250), restarting the first controller 15 when the inspected first power supplying and interrupting device 10 is normal, transmitting the second inspection result response information when the first inspection result request information is received from the first controller 15, and advancing to the second normal-case control, which is prepared for a case where the second controller 25 is normal (Steps S255 to S270).

FIG. 4A to FIG. 4D are flowcharts illustrating details of Processing SA100 and Processing SB100. First, details of Processing SA100 are described. Processing SA100 is executed in Step S140 of the first controller 15 in FIG. 3A so that the first controller 15 inspects (performs the self-diagnosis of) the second power supplying and interrupting device 20. When executing Processing SA100, the first controller 15 first advances the processing to Step SA110.

Figure 6:
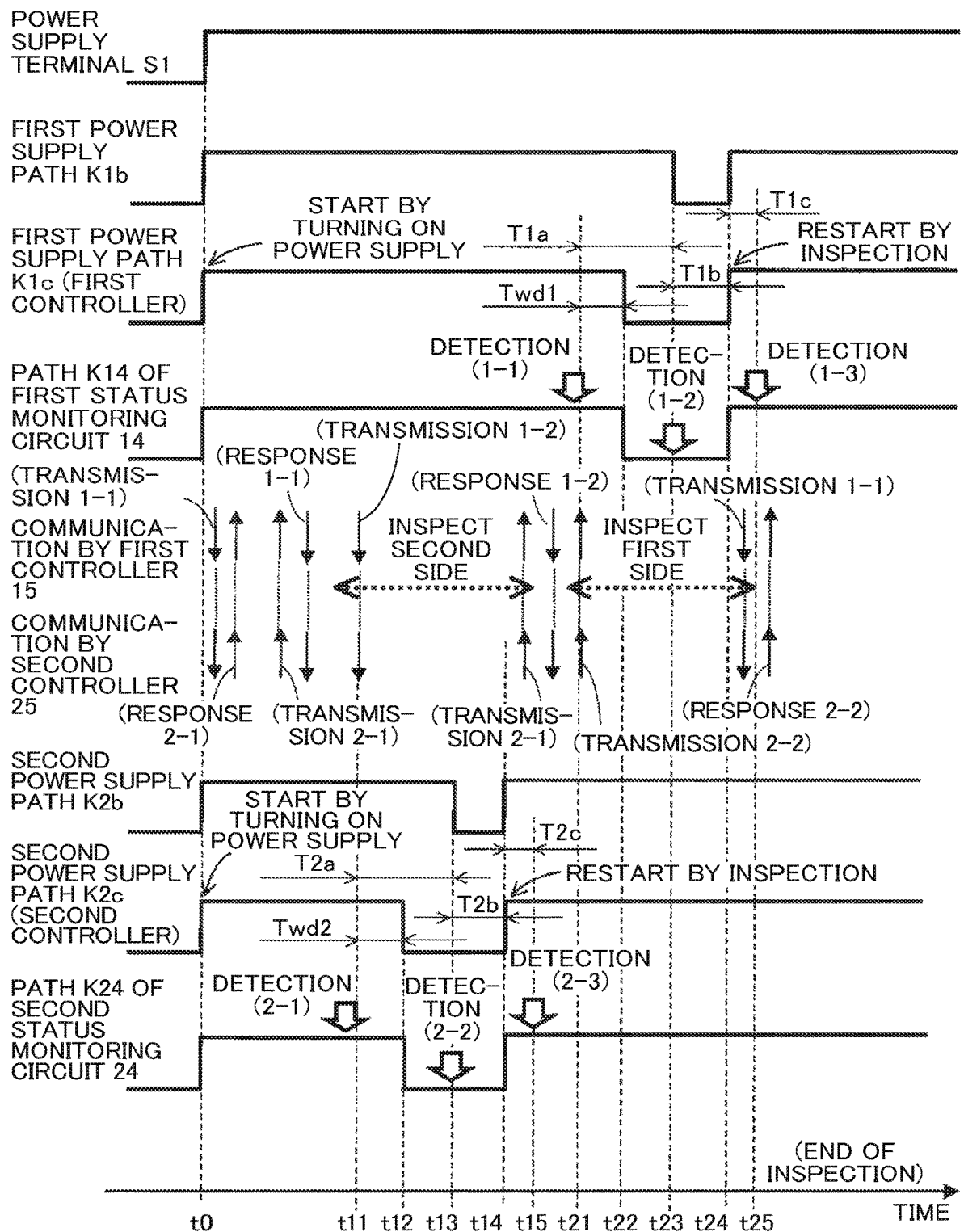
FIG. 6 is an illustration of operation waveforms indicating voltage conditions of respective portions when the processing of the flowcharts illustrated in FIG. 3A to FIG. 3D is executed by turning ON a power supply.

In Step SA110, the first controller 15 acquires an input from the second status monitoring circuit 24 via the path K24 ("Detection (2-1)" in FIG. 6), and determines whether electric power is supplied to the second power supply path K2c (that is, the second controller 25). When electric power is supplied to the second power supply path K2c (Yes), the first controller 15 advances the processing to Step SA115. When electric power is not supplied to the second power supply path K2c (No), the first controller 15 advances the processing to Step SA155B. At this time, electric power is supposed to be supplied to the second power supply path K2c when the second power supplying and interrupting device 20 is normal. When electric power is not supplied to the second power supply path K2c, the first controller 15 determines that the second power supplying and interrupting device 20 is abnormal, and advances the processing to Step SA155B.

When the processing is advanced to Step SA115, the first controller 15 transmits, to the second controller 25, simulative abnormality request information for requesting a simulative abnormal operation ((Transmission 1-2) in FIG. 6). The simulative abnormality request information is transmitted in order that the second monitoring circuit 23 determine that the operation of the second controller 25 is abnormal for the purpose of inspection. Then, the first controller 15 advances the processing to Step SA120. The second controller 25 that receives the simulative abnormality request information operates in a simulative abnormal state for the purpose of inspection. The second monitoring circuit 23 determines that the operation of the second controller 25 is abnormal, and outputs the interruption request signal to the second succeeding switching circuit 22 via the path K23. Then, the second succeeding switching circuit 22 to which the interruption request signal is input is switched from the connected state to the interrupted state, and the second power supply path K2c is switched to a state in which electric power is not supplied (non-power supply state).

When the processing is advanced to Step SA120, the first controller 15 determines whether a simulative abnormality waiting time (time T2a in FIG. 6) has elapsed. When the simulative abnormality waiting time has elapsed from execution of Step SA115 (Yes), the first controller 15 advances the processing to Step SA125. When the simulative abnormality waiting time has not elapsed (No), the first controller 15 returns the processing to Step SA120. The first controller 15 advances the processing to Step SA125 when the simulative abnormality waiting time (time T2a in FIG. 6) set longer than a time required until the second monitoring circuit 23 detects an abnormality (time Twd2 in FIG. 6) has elapsed after the simulative abnormality request information is transmitted to the second controller 25. The simulative abnormality waiting time is set to an appropriate value depending on, for example, an operation characteristic of the second monitoring circuit 23.

When the processing is advanced to Step SA125, the first controller 15 acquires an input from the second status monitoring circuit 24 via the path K24 ("Detection (2-2)" in FIG. 6), and determines whether the second power supply path K2c (that is, the second controller 25) is in the non-power supply state. When the second power supply path K2c is in the non-power supply state (Yes), the first controller 15 advances the processing to Step SA130. When the second power supply path K2c is not in the non-power supply state (No), the first controller 15 advances the processing to Step SA155B. At this time, the second power supply path K2c is supposed to be in the non-power supply state when the second power supplying and interrupting device 20 is normal. When the second power supply path K2c is in a power supply state, the first controller 15 determines that the second power supplying and interrupting device 20 is abnormal, and advances the processing to Step SA155B.

When the processing is advanced to Step SA130, the first controller 15 outputs the interruption request signal to the second preceding switching circuit 21 via the path K21, and advances the processing to Step SA135. When the interruption request signal is output from the first controller 15, the status of the second power supply path K2b is switched from the connected state (High level) to the interrupted state (Low level) as indicated by a time t13 at the second power supply path K2b in FIG. 6. Therefore, the power supply to the second succeeding switching circuit 22 is interrupted.

In Step SA135, the first controller 15 determines whether a preceding interruption waiting time (time T2b in FIG. 6) has elapsed. When the preceding interruption waiting time has elapsed from execution of Step SA130 (Yes), the first controller 15 advances the processing to Step SA140. When the preceding interruption waiting time has not elapsed (No), the first controller 15 returns the processing to Step SA135. The preceding interruption waiting time is set to an appropriate value depending on, for example, an operation characteristic of the second preceding switching circuit 21.

When the processing is advanced to Step SA140, the first controller 15 outputs the connection request signal to the second preceding switching circuit 21 via the path K21, and advances the processing to Step SA145. When the connection request signal is output from the first controller 15, the status of the second power supply path K2b is switched from the interrupted state (Low level) to the connected state (High level) as indicated by a time t14 at the second power supply path K2b in FIG. 6. Therefore, the second succeeding switching circuit 22 is restarted and initialized, and the interrupted state is switched to the connected state. Thus, the second power supply path K2c is switched from the interrupted state to the connected state, and the second controller 25 is restarted.

In Step SA145, the first controller 15 determines whether a preceding connection waiting time (time T2c in FIG. 6) has elapsed. When the preceding connection waiting time has elapsed from execution of Step SA140 (Yes), the first controller 15 advances the processing to Step SA150. When the preceding connection waiting time has not elapsed (No), the first controller 15 returns the processing to Step SA145. The preceding connection waiting time is set to an appropriate value depending on, for example, the operation characteristic of the second preceding switching circuit 21.

When the processing is advanced to Step SA150, the first controller 15 acquires an input from the second status monitoring circuit 24 via the path K24 ("Detection (2-3)" in FIG. 6), and determines whether the second power supply path K2c (that is, the second controller 25) is in the power supply state. When electric power is supplied to the second power supply path K2c (Yes), the first controller 15 advances the processing to Step SA155A. When electric power is not supplied to the second power supply path K2c (No), the first controller 15 advances the processing to Step SA155B. At this time, the second power supply path K2c is supposed to be in the power supply state when the second power supplying and interrupting device 20 is normal. When the second power supply path K2c is not in the power supply state, the first controller 15 determines that the second power supplying and interrupting device 20 is abnormal, and advances the processing to Step SA155B.

Figure 3A:
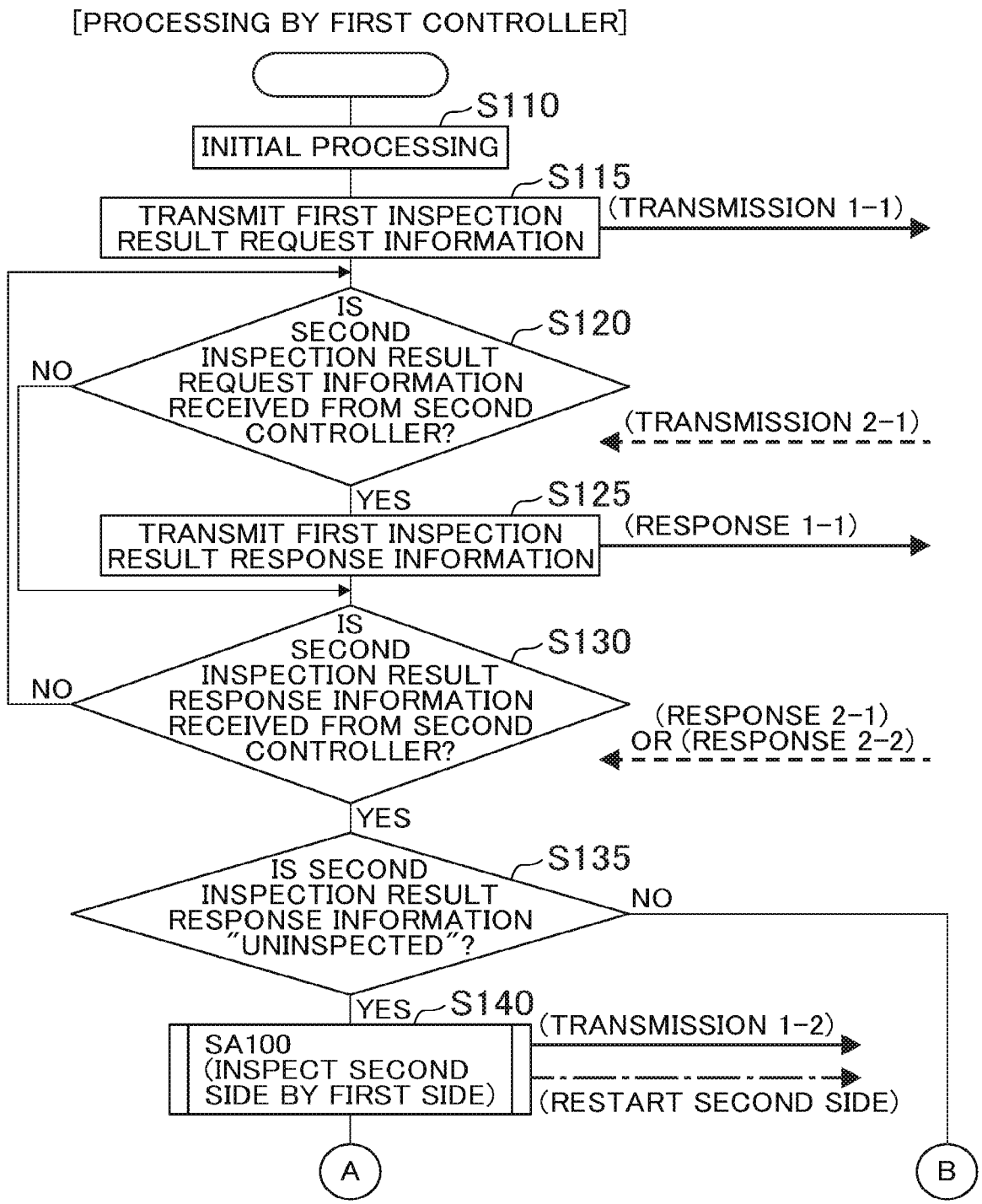
FIG. 3A to FIG. 3D are flowcharts for describing an example of processing procedures for inspecting (performing self-diagnosis of) power supplying and interrupting devices at the start of a first controller and a second controller of the power supply monitoring apparatus having a dual system.
Figure 3B:
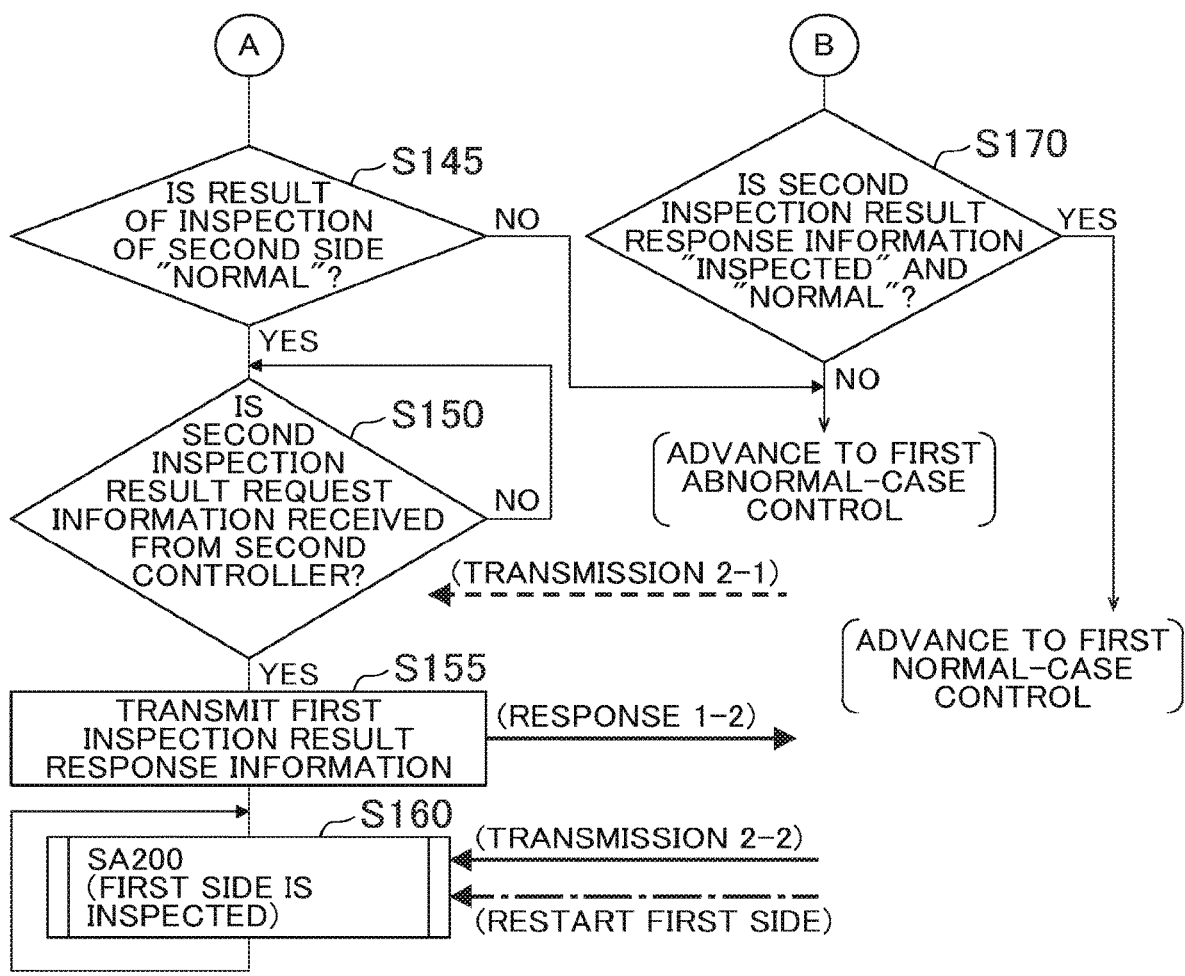
Figure 3C:
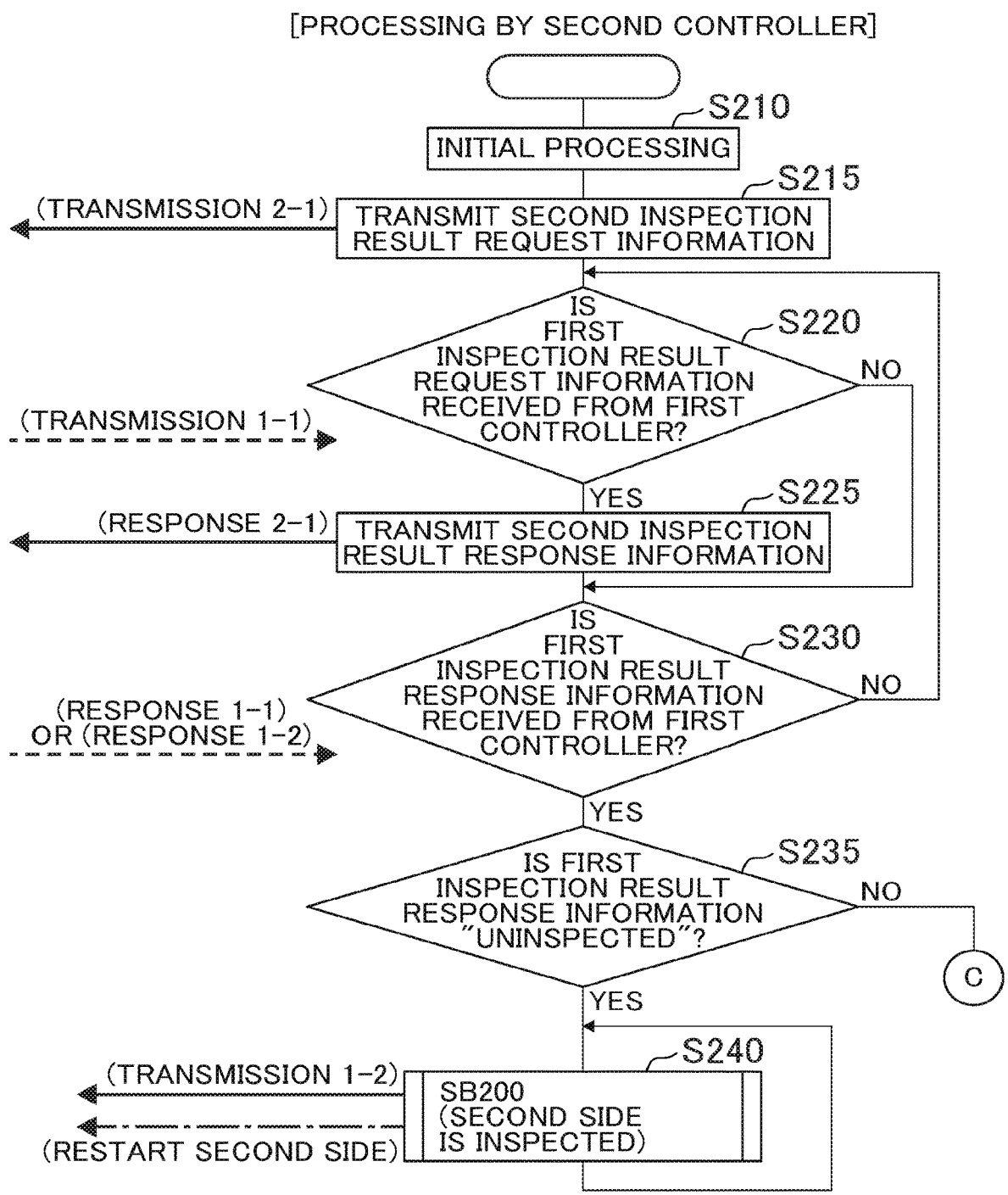

When the processing is advanced to Step SA155A, the first controller 15 stores information indicating that the result of the inspection of the second power supplying and interrupting device 20 is "normal", and terminates the processing (in this case, the processing returns to a point immediately after Step S140 of FIG. 3A).

When the processing is advanced to Step SA155B, the first controller 15 stores information indicating that the result of the inspection of the second power supplying and interrupting device 20 is "abnormal", and terminates the processing (in this case, the processing returns to the point immediately after Step S140 of FIG. 3A).

As described above, the first controller 15 includes, for the inspection (self-diagnosis) of the second power supplying and interrupting device 20, a second succeeding switching circuit inspecting step of checking, via the path K24 of the second status monitoring circuit 24, that electric power is supplied to the second controller 25 (second power supply path K2c) (Step SA110), transmitting, by the first controller 15, the simulative abnormality request information to the second controller 25 (Step SA115) to simulate an abnormality of the operation of the second controller 25 and switch the second succeeding switching circuit 22 to the interrupted state by using the second monitoring circuit 23, and checking, via the path K24 of the second status monitoring circuit 24, that the electric power is not supplied to the second controller 25 (second power supply path K2c) (Step SA125).

The first controller 15 includes a second preceding switching circuit inspecting step of outputting the interruption request signal for switching the second preceding switching circuit 21 to the interrupted state (Step SA130), outputting the connection request signal for switching the second preceding switching circuit 21 to the connected state (Step SA140), and checking, via the path K24 of the second status monitoring circuit 24, that the electric power is supplied to the second controller 25 (second power supply path K2c) (Step SA150).

Next, details of Processing SB100 illustrated in FIG. 4A to FIG. 4D are described. Processing SB100 is executed in Step S250 of the second controller 25 in FIG. 3D so that the second controller 25 inspects (performs the self-diagnosis of) the first power supplying and interrupting device 10. When executing Processing SB100, the second controller 25 first advances the processing to Step SB110.

In Step SB110, the second controller 25 acquires an input from the first status monitoring circuit 14 via the path K14 ("Detection (1-1)" in FIG. 6), and determines whether electric power is supplied to the first power supply path K1c (that is, the first controller 15). When electric power is supplied to the first power supply path K1c (Yes), the second controller 25 advances the processing to Step SB115. When electric power is not supplied to the first power supply path K1c (No), the second controller 25 advances the processing to Step SB155B. At this time, the first power supply path K1c is supposed to be in a power supply state when the first power supplying and interrupting device 10 is normal. When the first power supply path K1c is not in the power supply state, the second controller 25 determines that the first power supplying and interrupting device 10 is abnormal, and advances the processing to Step SB155B.

When the processing is advanced to Step SB115, the second controller 25 transmits, to the first controller 15, simulative abnormality request information for requesting a simulative abnormal operation ((Transmission 2-2) in FIG. 6). The simulative abnormality request information is transmitted in order that the first monitoring circuit 13 determine that the operation of the first controller 15 is abnormal for the purpose of inspection. Then, the second controller 25 advances the processing to Step SB120. The first controller 15 that receives the simulative abnormality request information operates in a simulative abnormal state for the purpose of inspection. The first monitoring circuit 13 determines that the operation of the first controller 15 is abnormal, and outputs the interruption request signal to the first succeeding switching circuit 12 via the path K13. Then, the first succeeding switching circuit 12 to which the interruption request signal is input is switched from the connected state to the interrupted state, and the first power supply path K1c is switched to a state in which electric power is not supplied (non-power supply state).

When the processing is advanced to Step SB120, the second controller 25 determines whether a simulative abnormality waiting time (time T1a in FIG. 6) has elapsed. When the simulative abnormality waiting time has elapsed from execution of Step SB115 (Yes), the second controller 25 advances the processing to Step SB125. When the simulative abnormality waiting time has not elapsed (No), the second controller 25 returns the processing to Step SB120. The second controller 25 advances the processing to Step SB125 when the simulative abnormality waiting time (time T1a in FIG. 6) set longer than a time required until the first monitoring circuit 13 detects an abnormality (time Twd1 in FIG. 6) has elapsed after the simulative abnormality request information is transmitted to the first controller 15. The simulative abnormality waiting time is set to an appropriate value depending on, for example, an operation characteristic of the first monitoring circuit 13.

When the processing is advanced to Step SB125, the second controller 25 acquires an input from the first status monitoring circuit 14 via the path K14 ("Detection (1-2)" in FIG. 6), and determines whether the first power supply path K1c (that is, the first controller 15) is in the non-power supply state. When the first power supply path K1c is in the non-power supply state (Yes), the second controller 25 advances the processing to Step SB130. When the first power supply path K1c is not in the non-power supply state (No), the second controller 25 advances the processing to Step SB155B. At this time, the first power supply path K1c is supposed to be in the non-power supply state when the first power supplying and interrupting device 10 is normal. When the first power supply path K1c is in a power supply state, the second controller 25 determines that the first power supplying and interrupting device 10 is abnormal, and advances the processing to Step SB155B.

When the processing is advanced to Step SB130, the second controller 25 outputs the interruption request signal to the first preceding switching circuit 11 via the path K11, and advances the processing to Step SB135. When the interruption request signal is output from the second controller 25, the status of the first power supply path K1b is switched from the connected state (High level) to the interrupted state (Low level) as indicated by a time t23 at the first power supply path K1b in FIG. 6. Therefore, the power supply to the first succeeding switching circuit 12 is interrupted.

In Step SB135, the second controller 25 determines whether a preceding interruption waiting time (time T1b in FIG. 6) has elapsed. When the preceding interruption waiting time has elapsed from execution of Step SB130 (Yes), the second controller 25 advances the processing to Step SB140. When the preceding interruption waiting time has not elapsed (No), the second controller 25 returns the processing to Step SB135. The preceding interruption waiting time is set to an appropriate value depending on, for example, an operation characteristic of the first preceding switching circuit 11.

When the processing is advanced to Step SB140, the second controller 25 outputs the connection request signal to the first preceding switching circuit 11 via the path K11, and advances the processing to Step SB145. When the connection request signal is output from the second controller 25, the status of the first power supply path K1b is switched from the interrupted state (Low level) to the connected state (High level) as indicated by a time t24 at the first power supply path K1b in FIG. 6. Therefore, the first succeeding switching circuit 12 is restarted and initialized, and the interrupted state is switched to the connected state. Thus, the first power supply path K1c is switched from the interrupted state to the connected state, and the first controller 15 is restarted.

In Step SB145, the second controller 25 determines whether a preceding connection waiting time (time T1c in FIG. 6) has elapsed. When the preceding connection waiting time has elapsed from execution of Step SB140 (Yes), the second controller 25 advances the processing to Step SB150. When the preceding connection waiting time has not elapsed (No), the second controller 25 returns the processing to Step SB145. The preceding connection waiting time is set to an appropriate value depending on, for example, the operation characteristic of the first preceding switching circuit 11.

When the processing is advanced to Step SB150, the second controller 25 acquires an input from the first status monitoring circuit 14 via the path K14 ("Detection (1-3)" in FIG. 6), and determines whether the first power supply path K1c (that is, the first controller 15) is in the power supply state. When electric power is supplied to the first power supply path K1c (Yes), the second controller 25 advances the processing to Step SB155A. When electric power is not supplied to the first power supply path K1c (No), the second controller 25 advances the processing to Step SB155B. At this time, the first power supply path K1c is supposed to be in the power supply state when the first power supplying and interrupting device 10 is normal. When the first power supply path K1c is not in the power supply state, the second controller 25 determines that the first power supplying and interrupting device 10 is abnormal, and advances the processing to Step SB155B.

Figure 3D:
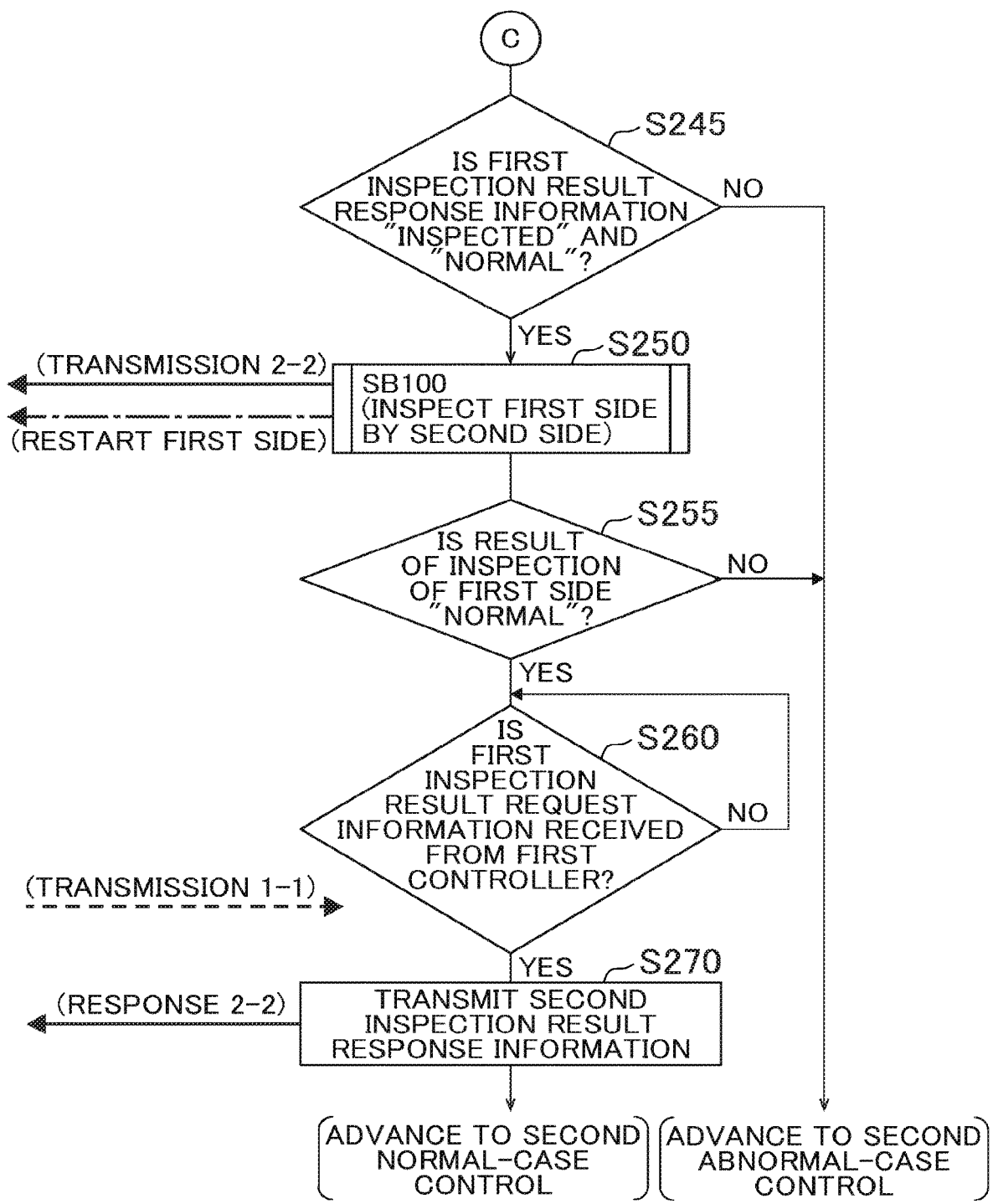

When the processing is advanced to Step SB155A, the second controller 25 stores information indicating that the result of the inspection of the first power supplying and interrupting device 10 is "normal", and terminates the processing (in this case, returns to a point immediately after Step S250 of FIG. 3D).

When the processing is advanced to Step SB155B, the second controller 25 stores information indicating that the result of the inspection of the first power supplying and interrupting device 10 is "abnormal", and terminates the processing (in this case, returns to the point immediately after Step S250 of FIG. 3D).

As described above, the second controller 25 includes, for the inspection (self-diagnosis) of the first power supplying and interrupting device 10, a first succeeding switching circuit inspecting step of checking, via the path K14 of the first status monitoring circuit 14, that electric power is supplied to the first controller 15 (first power supply path K1c) (Step SB110), transmitting, by the second controller 25, the simulative abnormality request information to the first controller 15 (Step SB115) to simulate an abnormality of the operation of the first controller 15 and switch the first succeeding switching circuit 12 to the interrupted state by using the first monitoring circuit 13, and checking, via the path K14 of the first status monitoring circuit 14, that the electric power is not supplied to the first controller 15 (first power supply path K1c) (Step SB125).

The second controller 25 includes a first preceding switching circuit inspecting step of outputting the interruption request signal for switching the first preceding switching circuit 11 to the interrupted state (Step SB130), outputting the connection request signal for switching the first preceding switching circuit 11 to the connected state (Step SB140), and checking, via the path K14 of the first status monitoring circuit 14, that the electric power is supplied to the first controller 15 (first power supply path K1c) (Step SB150).

Figure 5:
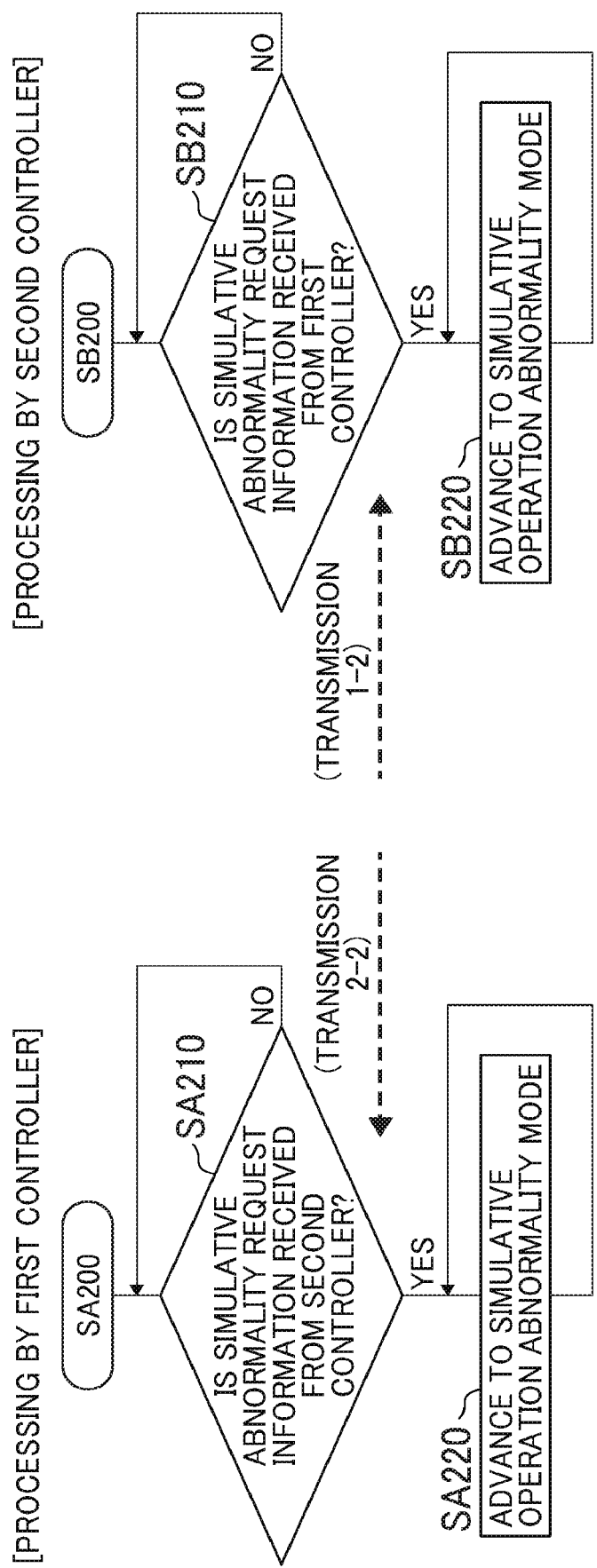
FIG. 5 is a flowchart for describing details of Processing SA200 and Processing SB200 in the flowcharts illustrated in FIG. 3A to FIG. 3D.

FIG. 5 is a flowchart illustrating details of Processing SA200 and Processing SB200. First, details of Processing SA200 are described. Processing SA200 is executed in Step S160 of the first controller 15 in FIG. 3B so that the first controller 15 waits while the second controller 25 is inspecting (performing the self-diagnosis of) the first power supplying and interrupting device 10. When executing Processing SA200, the first controller 15 first advances the processing to Step SA210.

Figure 4A:
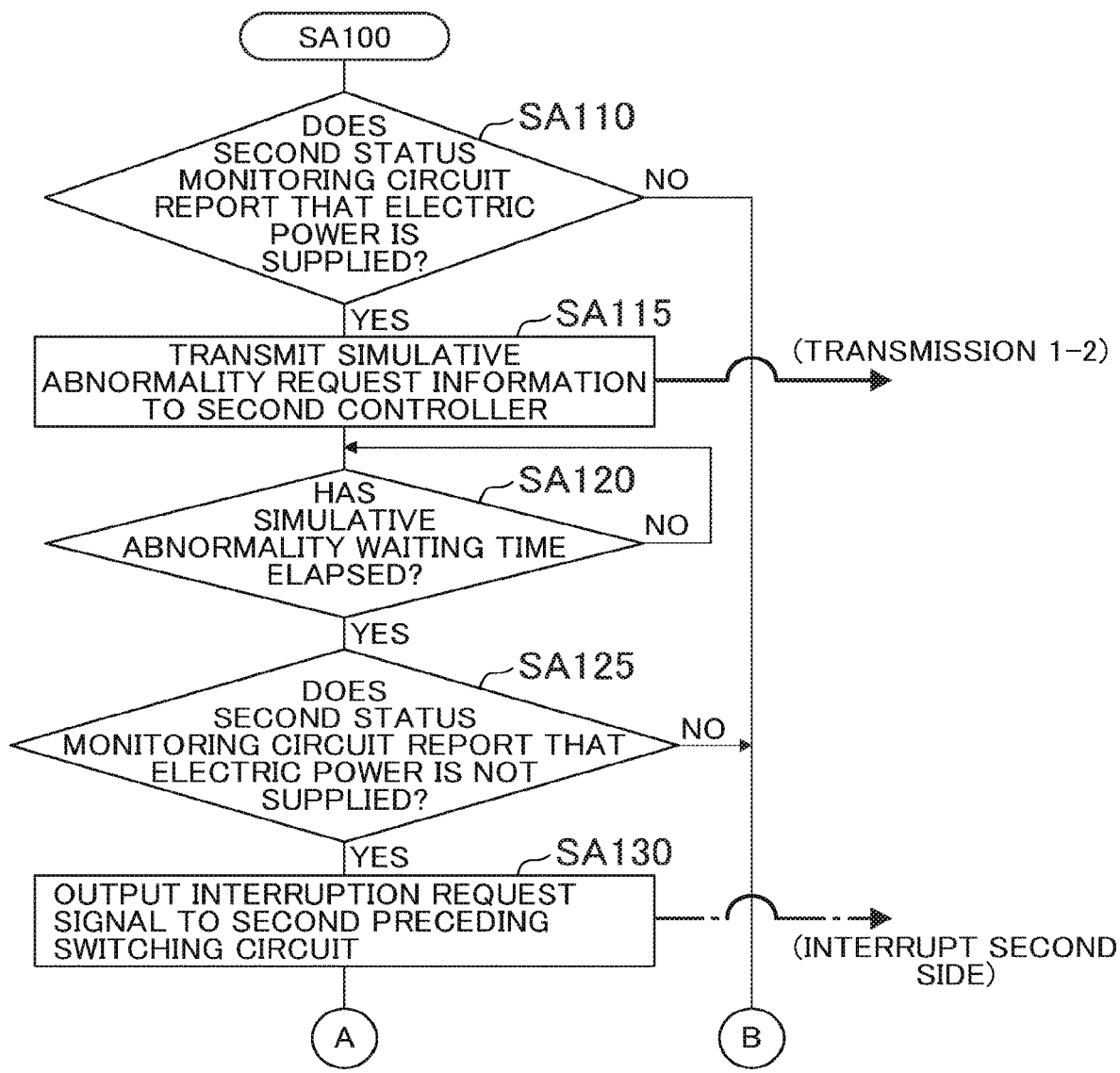
FIG. 4A to FIG. 4D are flowcharts for describing details of Processing SA100 and Processing SB100 in the flowcharts illustrated in FIG. 3A to FIG. 3D.
Figure 4B:
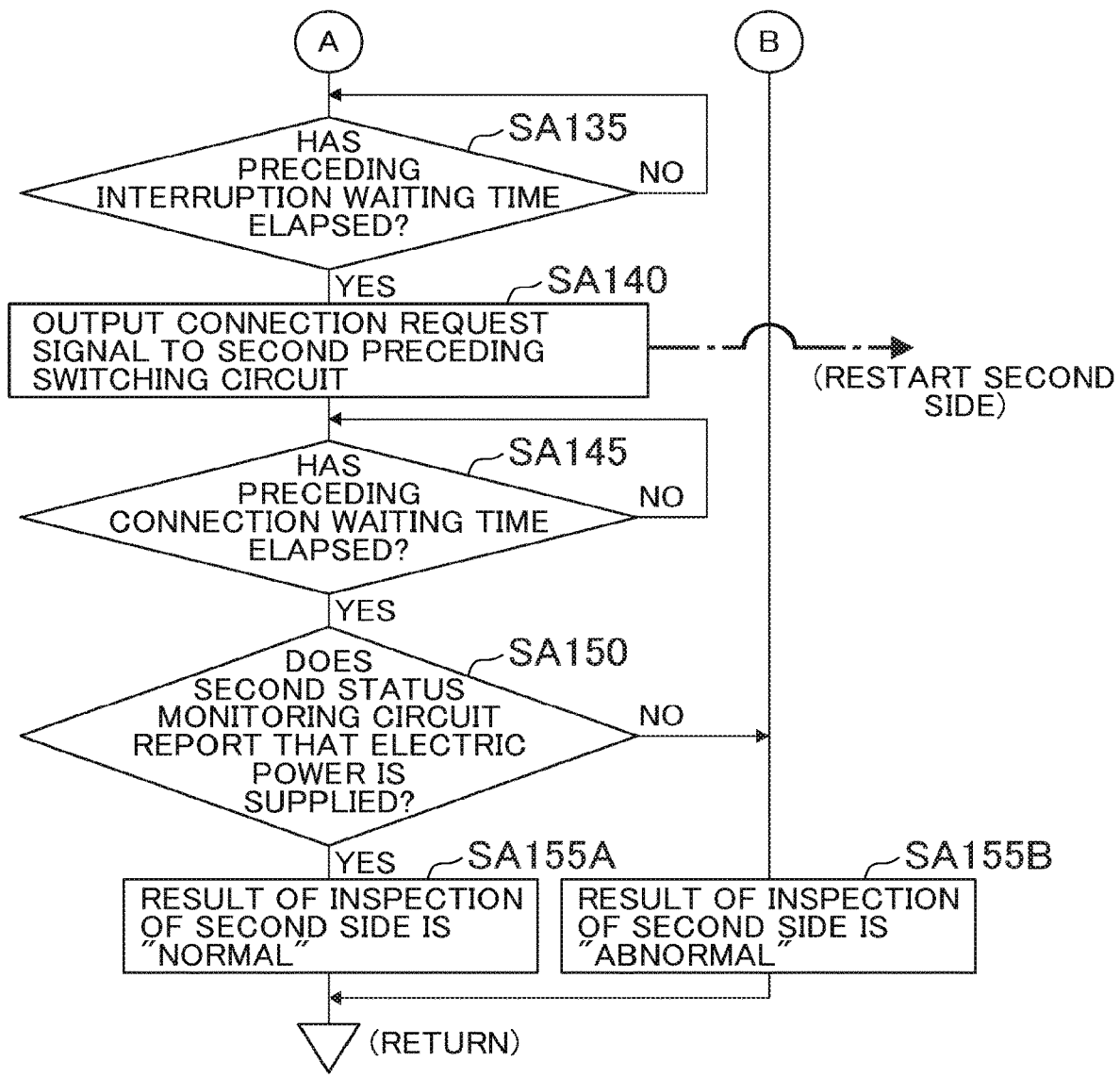
Figure 4C:
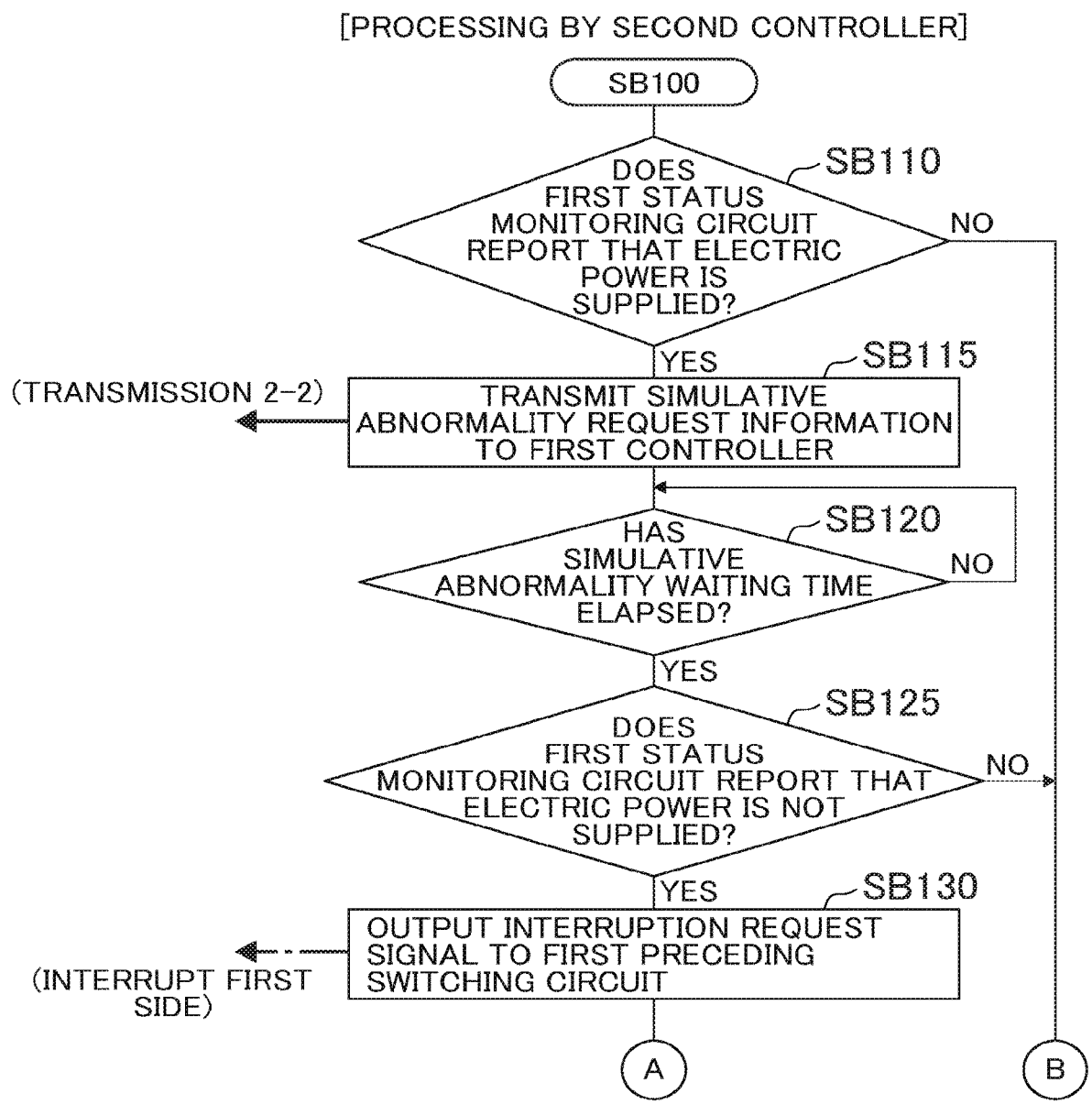
Figure 4D:
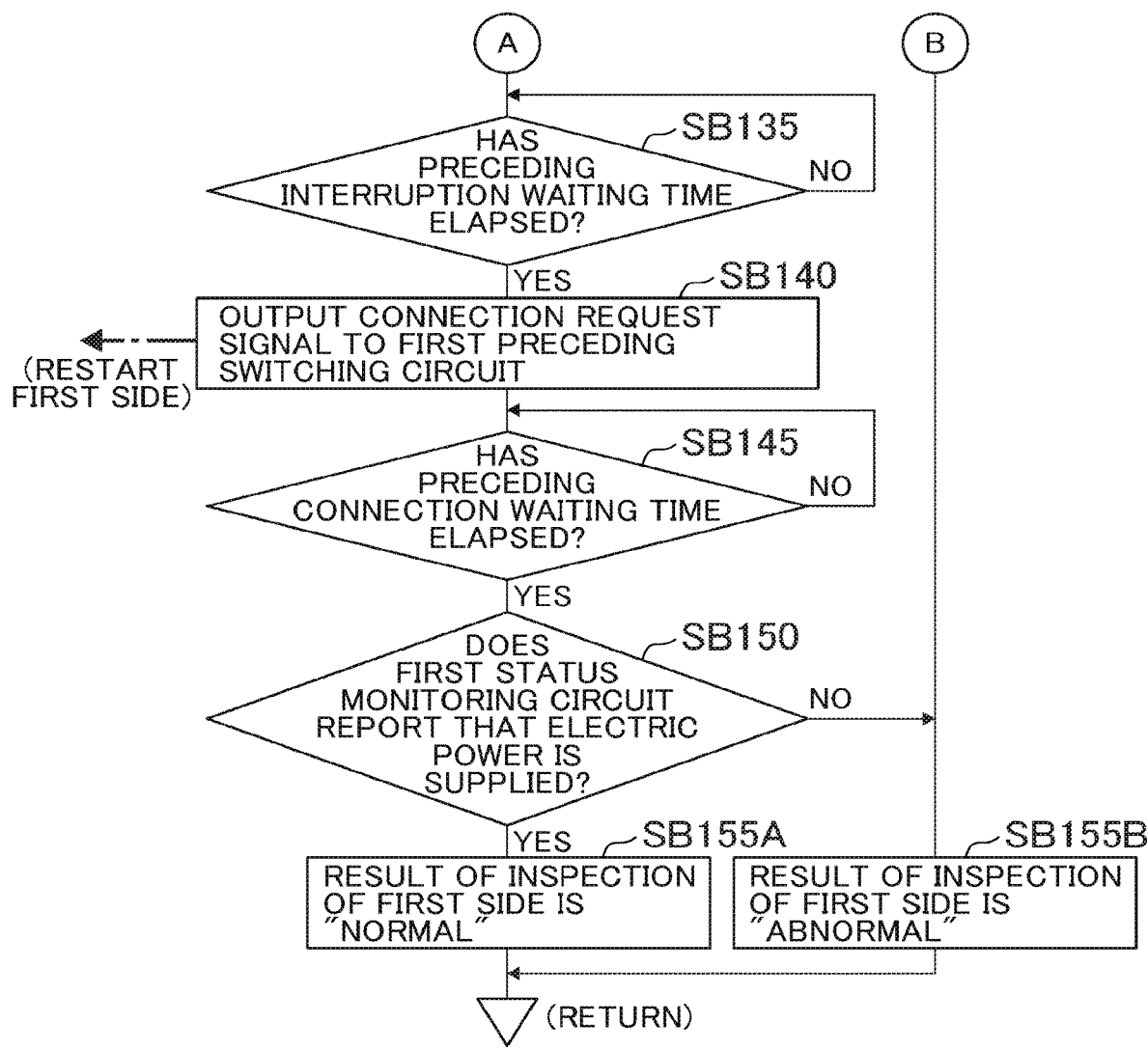

In Step SA210, the first controller 15 determines whether the simulative abnormality request information (simulative abnormality request information transmitted in Step SB115 of the second controller 25 in FIG. 4C) is received from the second controller 25. When the simulative abnormality request information is received from the second controller 25 (Yes), the first controller 15 advances the processing to Step SA220. When the simulative abnormality request information is not received from the second controller 25 (No), the first controller 15 returns the processing to Step SA210.

When the processing is advanced to Step SA220, the first controller 15 advances to a simulative operation abnormality mode, and returns the processing to Step SA220. That is, the first controller 15 repeats the processing of Step SA220 until the second controller 25 terminates the inspection and the first controller 15 is restarted in Step SB140 of the second controller 25 in FIG. 4D. When the first controller 15 is restarted, the first controller 15 resumes the processing from Step S110 illustrated in FIG. 3A. When the first controller 15 advances to the simulative operation abnormality mode, for example, the first controller 15 stops outputting, to the first monitoring circuit 13, the pulse having the High level and the Low level repeated periodically (fixes the pulse at the High level or the Low level).

Next, details of Processing SB200 illustrated in FIG. 5 are described. Processing SB200 is executed in Step S240 of the second controller 25 in FIG. 3C so that the second controller 25 waits while the first controller 15 is inspecting (performing the self-diagnosis of) the second power supplying and interrupting device 20. When executing Processing SB200, the second controller 25 first advances the processing to Step SB210.

In Step SB210, the second controller 25 determines whether the simulative abnormality request information (simulative abnormality request information transmitted in Step SA115 of the first controller 15 in FIG. 4A) is received from the first controller 15. When the simulative abnormality request information is received from the first controller 15 (Yes), the second controller 25 advances the processing to Step SB220. When the simulative abnormality request information is not received from the first controller 15 (No), the second controller 25 returns the processing to Step SB210.

When the processing is advanced to Step SB220, the second controller 25 advances to a simulative operation abnormality mode, and returns the processing to Step SB220. That is, the second controller 25 repeats the processing of Step SB220 until the first controller 15 terminates the inspection and the second controller 25 is restarted in Step SA140 of the first controller 15 in FIG. 4B. When the second controller 25 is restarted, the second controller 25 resumes the processing from Step S210 illustrated in FIG. 3C. When the second controller 25 advances to the simulative operation abnormality mode, for example, the second controller 25 stops outputting, to the second monitoring circuit 23, the pulse having the High level and the Low level repeated periodically (fixes the pulse at the High level or the Low level).

In FIG. 7, wide dashed lines indicate flows of a current from the power supply in a case where the first power supplying and interrupting device 10 is in the interrupted state and the second power supplying and interrupting device 20 is in the connected state. Since the first power supplying and interrupting device 10 is in the interrupted state, the switching device 11c is in the open state. Since the direction of the diode 11x is opposite to the direction of the flow of the current, the current flowing into the first power supply path K1a from the power supply terminal S1 is blocked by the diode 11x, and does not flow into the first power supply path K1b. Since the second power supplying and interrupting device 20 is in the connected state, the switching devices 21c, 22c, and 22d are in the short-circuited state. The current flowing into the second power supply path K2a from the power supply terminal S1 reaches the second controller 25 via the second power supply path K2b, and reaches the peripheral circuit 31 via the second power supply path K2b and the common power supply paths K2d and K3a. The current flowing through the common power supply paths K2d and K1d is blocked by the diode 12y, and does not flow into the first power supply path K1b because the switching device 12d is in the open state and the direction of the diode 12y is opposite to the direction of the flow of the current.

That is, when the first power supplying and interrupting device 10 is in the interrupted state and the second power supplying and interrupting device 20 is in the connected state, the first controller 15 is in the interrupted state, the second controller 25 is in the connected state (supplied state), and the peripheral circuit 31 is in the connected state (supplied state). Although illustration is omitted, when the first power supplying and interrupting device 10 is in the connected state and the second power supplying and interrupting device 20 is in the interrupted state, the first controller 15 is in the connected state (supplied state), the second controller 25 is in the interrupted state, and the peripheral circuit 31 is in the connected state (supplied state). To achieve this, the power supply monitoring apparatus 1 has the following configuration.

The peripheral circuit 31 is supplied with electric power from the power supply via the first power supplying and interrupting device 10 (via the first power supply paths K1a and K1b and the common power supply paths K1d and K3a), and via the second power supplying and interrupting device 20 (via the second power supply paths K2a and K2b and the common power supply paths K2d and K3a). That is, when at least one of the first power supplying and interrupting device 10 and the second power supplying and interrupting device 20 is in the connected state, the peripheral circuit 31 is supplied with electric power from the power supply (power supply terminal S1) via the side in the connected state.

The first power supplying and interrupting device 10 has a first controller terminal P1a and a first peripheral terminal P1b. The first controller terminal P1a is connected to the first controller 15, and supplies electric power to the first controller 15. The first peripheral terminal P1b is connected to the peripheral circuit 31, and supplies electric power to the peripheral circuit 31. When the first power supplying and interrupting device 10 is in the connected state, the first controller terminal P1a and the first peripheral terminal P1b are brought into conduction (because the switching device 12*d* is in the short-circuited state), and both of the terminals are supplied with electric power from the first preceding switching circuit 11 (because the switching devices 11*c*, 12*c*, and 12*d* are in the short-circuited state). When the first power supplying and interrupting device 10 is in the interrupted state, the first controller terminal P1*a* and the first peripheral terminal P1*b* are connected so that a current flows only in a direction from the first controller terminal P1*a* to the first peripheral terminal P1*b* (the switching device 12*d* is in the open state and the connection is caused by the diode 12*y*), and neither of the terminals is supplied with electric power from the first preceding switching circuit 11 (because the switching devices 11*c*, 12*c*, and 12*d* are in the open state).

The second power supplying and interrupting device 20 has a second controller terminal P2*a* and a second peripheral terminal P2*b*. The second controller terminal P2*a* is connected to the second controller 25, and supplies electric power to the second controller 25. The second peripheral terminal P2*b* is connected to the peripheral circuit 31, and supplies electric power to the peripheral circuit 31. When the second power supplying and interrupting device 20 is in the connected state, the second controller terminal P2*a* and the second peripheral terminal P2*b* are brought into conduction (because the switching device 22*d* is in the short-circuited state), and both of the terminals are supplied with electric power from the second preceding switching circuit 21 (because the switching devices 21*c*, 22*c*, and 22*d* are in the short-circuited state). When the second power supplying and interrupting device 20 is in the interrupted state, the second controller terminal P2*a* and the second peripheral terminal P2*b* are connected so that a current flows only in a direction from the second controller terminal P2*a* to the second peripheral terminal P2*b* (the switching device 22*d* is in the open state and the connection is caused by the diode 22*y*), and neither of the terminals is supplied with electric power from the second preceding switching circuit 21 (because the switching devices 21*c*, 22*c*, and 22*d* are in the open state).

The power supply monitoring apparatus 1 described above in this embodiment has the dual system for the power supplying and interrupting device configured to supply or interrupt electric power (first power supplying and interrupting device 10 and second power supplying and interrupting device 20) in relation to the dual-system controllers (first controller 15 and second controller 25). Thus, the self-diagnosis of the connected state and the interrupted state of the first power supplying and interrupting device 10 can be performed by the second controller 25, and the self-diagnosis of the connected state and the interrupted state of the second power supplying and interrupting device 20 can be performed by the first controller 15. The first power supplying and interrupting device 10 and the second power supplying and interrupting device 20 are configured to switch the connected state and the interrupted state depending on electric power (power supply voltage) supplied from the power supply to the respective controllers. The self-diagnosis of the connected state and the interrupted state of each of the first power supplying and interrupting device 10 and the second power supplying and interrupting device 20 can appropriately be performed through the processing procedures described in this embodiment.

Various types of modification, addition, or deletion may be made to the configuration of the power supply monitoring apparatus 1, the processing procedures of the power supply monitoring method, and other features of the present invention without changing the spirit of the present invention. For example, the processing procedures of the first controller 15 and the second controller 25 are not limited to the processing procedures illustrated in FIG. 3A to FIG. 5, and the operation waveforms are not limited to the operation waveforms illustrated in FIG. 6.

The application of the power supply monitoring apparatus and the power supply monitoring method of the present invention is not limited to that to the PLC. The power supply monitoring apparatus and the power supply monitoring method are applicable to monitoring of power supplies of various systems including dual-system controllers.

What is claimed is:

1. A power supply monitoring apparatus, comprising:
   a first controller to be supplied with electric power from a power supply via a first power supply path;
   a second controller to be supplied with the electric power from the power supply via a second power supply path;
   a first power supplying and interrupting device configured to switch a connected state and an interrupted state of the first power supply path from the power supply to the first controller depending on the electric power supplied from the power supply;
   a second power supplying and interrupting device configured to switch a connected state and an interrupted state of the second power supply path from the power supply to the second controller depending on the electric power supplied from the power supply; and
   a communication circuit connected to the first controller and the second controller to enable transmission and reception of information between the first controller and the second controller, wherein
   the first controller is configured to inspect switching of the connected state and the interrupted state by the second power supplying and interrupting device when the power supply is turned ON,
   the second controller is configured to inspect switching of the connected state and the interrupted state by the first power supplying and interrupting device when the power supply is turned ON,
   the first controller is configured to:
      distinguish, when the first controller is started, whether the first controller is currently started by turning ON the power supply or by inspecting the first power supplying and interrupting device through transmission and reception of information to and from the second controller;
      inspect the second power supplying and interrupting device when the first controller is started by turning ON the power supply, restart the second controller when a result of inspection of the second power supplying and interrupting device is normal, transmit the result of the inspection when a request for the result of the inspection is received from the second controller, and wait for inspection of the first power supplying and interrupting device by the second controller; and
      transmit a request for a result of the inspection of the first power supplying and interrupting device to the second controller and receive the result of the inspection when the first controller is started by inspecting the first power supplying and interrupting device, and advance to first normal-case control, which is prepared for a case where the first controller is normal, when the received result of the inspection is normal, and the second controller is configured to:
  distinguish, when the second controller is started, whether the second controller is currently started by turning ON the power supply or by inspecting the second power supplying and interrupting device through transmission and reception of information to and from the first controller;
  wait for the inspection of the second power supplying and interrupting device by the first controller when the second controller is started by turning ON the power supply; and
  transmit the request for the result of the inspection of the second power supplying and interrupting device to the first controller and receive the result of the inspection when the second controller is started by inspecting the second power supplying and interrupting device, inspect the first power supplying and interrupting device when the received result of the inspection is normal, restart the first controller when the result of the inspection of the first power supplying and interrupting device is normal, transmit the result of the inspection when the request for the result of the inspection is received from the first controller, and advance to second normal-case control, which is prepared for a case where the second controller is normal.

2. The power supply monitoring apparatus according to claim 1, wherein
  the first power supplying and interrupting device includes:
    a first preceding switching circuit provided on a power supply side in the first power supply path and to be switched to the connected state or the interrupted state depending on a voltage supplied from the power supply or a control signal output from the second controller;
    a first succeeding switching circuit provided on a first controller side in the first power supply path and to be switched to the connected state or the interrupted state;
    a first monitoring circuit configured to monitor an operation of the first controller and switch the first succeeding switching circuit from the connected state to the interrupted state when the first monitoring circuit determines that the operation of the first controller is abnormal; and
    a first status monitoring circuit configured to enable the second controller to monitor whether the electric power is supplied from the first succeeding switching circuit to the first controller, and
  the second power supplying and interrupting device includes:
    a second preceding switching circuit provided on the power supply side in the second power supply path and to be switched to the connected state or the interrupted state depending on the voltage supplied from the power supply or a control signal output from the first controller;
    a second succeeding switching circuit provided on a second controller side in the second power supply path and to be switched to the connected state or the interrupted state;
    a second monitoring circuit configured to monitor an operation of the second controller and switch the second succeeding switching circuit from the connected state to the interrupted state when the second monitoring circuit determines that the operation of the second controller is abnormal; and
    a second status monitoring circuit configured to enable the first controller to monitor whether the electric power is supplied from the second succeeding switching circuit to the second controller.

3. The power supply monitoring apparatus according to claim 2, wherein
  the first controller is configured to, for the inspection of the second power supplying and interrupting device:
    cause the second status monitoring circuit to check that the electric power is supplied to the second controller;
    transmit simulative abnormality request information to the second controller to simulate an abnormality of the operation of the second controller and switch the second succeeding switching circuit to the interrupted state by using the second monitoring circuit, and cause the second status monitoring circuit to check that the electric power is not supplied to the second controller; and
    output a control signal for switching the second preceding switching circuit to the interrupted state, output a control signal for switching the second preceding switching circuit to the connected state, and cause the second status monitoring circuit to check that the electric power is supplied to the second controller to determine that the second power supplying and interrupting device is normal, and
  the second controller is configured to, for the inspection of the first power supplying and interrupting device:
    cause the first status monitoring circuit to check that the electric power is supplied to the first controller;
    transmit simulative abnormality request information to the first controller to simulate an abnormality of the operation of the first controller and switch the first succeeding switching circuit to the interrupted state by using the first monitoring circuit, and cause the first status monitoring circuit to check that the electric power is not supplied to the first controller; and
    output a control signal for switching the first preceding switching circuit to the interrupted state, output a control signal for switching the first preceding switching circuit to the connected state, and cause the first status monitoring circuit to check that the electric power is supplied to the first controller to determine that the first power supplying and interrupting device is normal.

4. The power supply monitoring apparatus according to claim 2, wherein photonic devices each configured to transmit a signal while electrically insulating an input side from an output side are provided in:
  a path from the first status monitoring circuit to the second controller;
  a path from the second status monitoring circuit to the first controller;
  a path from the first controller to the second preceding switching circuit;
  a path from the second controller to the first preceding switching circuit;
  a path from the first monitoring circuit to the first succeeding switching circuit; and
  a path from the second monitoring circuit to the second succeeding switching circuit.

5. The power supply monitoring apparatus according to claim 1, further comprising a peripheral circuit configured such that, when at least one of the first power supplying and interrupting device and the second power supplying and interrupting device is in the connected state, the peripheral circuit is supplied with the electric power from the power supply via the at least one of the first power supplying and interrupting device and the second power supplying and interrupting device that is in the connected state.

6. The power supply monitoring apparatus according to claim 5, wherein
the first power supplying and interrupting device includes:
a first controller terminal that is connected to the first controller and supplies the electric power to the first controller; and
a first peripheral terminal that is connected to the peripheral circuit and supplies the electric power to the peripheral circuit,
when the first power supplying and interrupting device is in the connected state, the first controller terminal and the first peripheral terminal are brought into conduction, and both the first controller terminal and the first peripheral terminal are supplied with the electric power from the first preceding switching circuit,
when the first power supplying and interrupting device is in the interrupted state, the first controller terminal and the first peripheral terminal are connected so that a current flows only in a direction from the first controller terminal to the first peripheral terminal, and neither the first controller terminal nor the first peripheral terminal is supplied with the electric power from the first preceding switching circuit,
the second power supplying and interrupting device includes:
a second controller terminal that is connected to the second controller and supplies the electric power to the second controller; and
a second peripheral terminal that is connected to the peripheral circuit and supplies the electric power to the peripheral circuit,
when the second power supplying and interrupting device is in the connected state, the second controller terminal and the second peripheral terminal are brought into conduction, and both the second controller terminal and the second peripheral terminal are supplied with the electric power from the second preceding switching circuit, and
when the second power supplying and interrupting device is in the interrupted state, the second controller terminal and the second peripheral terminal are connected so that the current flows only in a direction from the second controller terminal to the second peripheral terminal, and neither the second controller terminal nor the second peripheral terminal is supplied with the electric power from the second preceding switching circuit.

7. A power supply monitoring method using:
a first controller to be supplied with electric power from a power supply via a first power supply path;
a second controller to be supplied with the electric power from the power supply via a second power supply path;
a first power supplying and interrupting device configured to switch a connected state and an interrupted state of the first power supply path from the power supply to the first controller depending on the electric power supplied from the power supply;
a second power supplying and interrupting device configured to switch a connected state and an interrupted state of the second power supply path from the power supply to the second controller depending on the electric power supplied from the power supply; and
a communication circuit is connected to the first controller and the second controller to enable transmission and reception of information between the first controller and the second controller,
the power supply monitoring method comprising:
inspecting, by using the first controller, switching of the connected state and the interrupted state by the second power supplying and interrupting device when the power supply is turned ON;
inspecting, by using the second controller, switching of the connected state and the interrupted state by the first power supplying and interrupting device when the power supply is turned ON;
distinguishing, by the first controller, when the first controller is started, whether the first controller is currently started by turning ON the power supply or by inspecting the first power supplying and interrupting device through transmission and reception of information to and from the second controller;
inspecting, by the first controller, the second power supplying and interrupting device when the first controller is started by turning ON the power supply, restarting the second controller when a result of inspection of the second power supplying and interrupting device is normal, transmitting the result of the inspection when a request for the result of the inspection is received from the second controller, and waiting for inspection of the first power supplying and interrupting device by the second controller;
transmitting, by the first controller, a request for a result of the inspection of the first power supplying and interrupting device to the second controller and receiving the result of the inspection when the first controller is started by inspecting the first power supplying and interrupting device, and advancing to first normal-case control, which is prepared for a case where the first controller is normal, when the received result of the inspection is normal;
distinguishing, by the second controller, when the second controller is started, whether the second controller is currently started by turning ON the power supply or by inspecting the second power supplying and interrupting device through transmission and reception of information to and from the first controller
waiting, by the second controller, for the inspection of the second power supplying and interrupting device by the first controller when the second controller is started by turning ON the power supply; and
transmitting, by the second controller, the request for the result of the inspection of the second power supplying and interrupting device to the first controller and receiving the result of the inspection when the second controller is started by inspecting the second power supplying and interrupting device, inspecting the first power supplying and interrupting device when the received result of the inspection is normal, restarting the first controller when the result of the inspection of the first power supplying and interrupting device is normal, transmitting the result of the inspection when the request for the result of the inspection is received from the first controller, and advancing to second normal-case control, which is prepared for a case where the second controller is normal.

8. The power supply monitoring method according to claim 7, wherein the first power supplying and interrupting device includes:
- a first preceding switching circuit provided on a power supply side in the first power supply path and to be switched to the connected state or the interrupted state depending on a voltage supplied from the power supply or a control signal output from the second controller;
- a first succeeding switching circuit provided on a first controller side in the first power supply path and to be switched to the connected state or the interrupted state;
- a first monitoring circuit configured to monitor an operation of the first controller and switch the first succeeding switching circuit from the connected state to the interrupted state when the first monitoring circuit determines that the operation of the first controller is abnormal; and
- a first status monitoring circuit configured to enable the second controller to monitor whether the electric power is supplied from the first succeeding switching circuit to the first controller, the second power supplying and interrupting device includes:
- a second preceding switching circuit provided on the power supply side in the second power supply path and to be switched to the connected state or the interrupted state depending on the voltage supplied from the power supply or a control signal output from the first controller;
- a second succeeding switching circuit provided on a second controller side in the second power supply path and to be switched to the connected state or the interrupted state;
- a second monitoring circuit configured to monitor an operation of the second controller and switch the second succeeding switching circuit from the connected state to the interrupted state when the second monitoring circuit determines that the operation of the second controller is abnormal; and
- a second status monitoring circuit configured to enable the first controller to monitor whether the electric power is supplied from the second succeeding switching circuit to the second controller, the power supply monitoring method includes, for the inspection of the second power supplying and interrupting device:
- causing, by the first controller, the second status monitoring circuit to check that the electric power is supplied to the second controller, transmitting simulative abnormality request information to the second controller to simulate an abnormality of the operation of the second controller and switch the second succeeding switching circuit to the interrupted state by using the second monitoring circuit, and causing the second status monitoring circuit to check that the electric power is not supplied to the second controller; and
- outputting, by the first controller, a control signal for switching the second preceding switching circuit to the interrupted state, outputting a control signal for switching the second preceding switching circuit to the connected state, and causing the second status monitoring circuit to check that the electric power is supplied to the second controller, and the power supply monitoring method includes, for the inspection of the first power supplying and interrupting device:
- causing, by the second controller, the first status monitoring circuit to check that the electric power is supplied to the first controller, transmitting simulative abnormality request information to the first controller to simulate an abnormality of the operation of the first controller and switch the first succeeding switching circuit to the interrupted state by using the first monitoring circuit, and causing the first status monitoring circuit to check that the electric power is not supplied to the first controller; and
- outputting, by the second controller, a control signal for switching the first preceding switching circuit to the interrupted state, outputting a control signal for switching the first preceding switching circuit to the connected state, and causing the first status monitoring circuit to check that the electric power is supplied to the first controller.

* * * * *